(12) United States Patent
Okamoto et al.

(10) Patent No.: US 10,896,980 B2
(45) Date of Patent: Jan. 19, 2021

(54) SEMICONDUCTOR DEVICE

(71) Applicant: RENESAS ELECTRONICS CORPORATION, Tokyo (JP)

(72) Inventors: Yasuhiro Okamoto, Ibaraki (JP); Nobuo Machida, Ibaraki (JP); Kenichi Hisada, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/598,832

(22) Filed: Oct. 10, 2019

(65) Prior Publication Data
US 2020/0161480 A1  May 21, 2020

(30) Foreign Application Priority Data

Nov. 15, 2018  (JP) .................. 2018-214459

(51) Int. Cl.
| | |
|---|---|
| H01L 29/872 | (2006.01) |
| H01L 29/66 | (2006.01) |
| H01L 29/06 | (2006.01) |
| H01L 29/08 | (2006.01) |
| H01L 29/417 | (2006.01) |
| H01L 29/16 | (2006.01) |
| H01L 29/47 | (2006.01) |

(52) U.S. Cl.
CPC ...... *H01L 29/8725* (2013.01); *H01L 29/0619* (2013.01); *H01L 29/086* (2013.01); *H01L 29/1608* (2013.01); *H01L 29/41766* (2013.01); *H01L 29/47* (2013.01); *H01L 29/6606* (2013.01); *H01L 29/66068* (2013.01); *H01L 29/872* (2013.01)

(58) Field of Classification Search
CPC ......... H01L 29/66613–66628; H01L 29/6606; H01L 29/66068; H01L 29/1608; H01L 29/872; H01L 29/7825; H01L 29/7813
See application file for complete search history.

(56) References Cited

U.S. PATENT DOCUMENTS

| | | | |
|---|---|---|---|
| 9,184,286 B2 | 11/2015 | Nakano | |
| 9,472,405 B2 * | 10/2016 | Nakano | ................ H01L 29/518 |
| 10,074,741 B2 * | 9/2018 | Aichinger | ............. H01L 29/401 |
| 10,580,870 B2 * | 3/2020 | Utsumi | ............... H01L 21/0495 |

FOREIGN PATENT DOCUMENTS

WO   2012/105609 A1   8/2012

* cited by examiner

*Primary Examiner* — Jose R Diaz
(74) *Attorney, Agent, or Firm* — McDermott Will & Emery LLP

(57) ABSTRACT

In a Schottky barrier diode region, a Schottky barrier diode is formed between an n-type drift layer and a metal layer, and in a body diode region, a p-type semiconductor region, a p-type semiconductor region, and a p-type semiconductor region are formed in order from a main surface side in the drift layer, and a body diode is formed between the p-type semiconductor region and the drift layer. An impurity concentration of the p-type semiconductor region is decreased lower than the impurity concentration of the p-type semiconductor regions, thereby increasing the reflux current flowing through the Schottky barrier diode and preventing the reflux current from flowing through the body diode.

15 Claims, 26 Drawing Sheets

SEMICONDUCTOR DEVICE

CROSS-REFERENCE TO RELATED APPLICATIONS

The disclosure of Japanese Patent Application No. 2018-214459 filed on Nov. 15, 2018 including the specification, drawings and abstract is incorporated herein by reference in its entirety.

BACKGROUND

The disclosed embodiment relates to semiconductor device, particularly, it relates to semiconductor devices using silicon carbide (SiC) power device.

SiC semiconductors have been studied as a power device for replacing Si semiconductors. SiC power device can realize high withstand voltage, large current, low on-resistance, etc. as compared with Si power devices, and, for example, SiC power device is used as switching element of inverter circuit such as motor control systems, etc. And, a diode is connected in parallel with the switching element.

In the inverter circuit, when the SiC power device (switching element) is turned off to cut off a current flowing through a motor coil, a counter electromotive force is generated in the motor coil by an electromagnetic induction of the motor coil. A current caused by the counter electromotive force is supplied as a reflux current to the motor coil through the diode, thereby preventing a high counter electromotive force from being applied to the switching element.

WO2012/105609 discloses a SiC power device embedded a Schottky barrier diode (SBD). The SiC power device is a semiconductor device in which a trench gate type Metal Oxide Semiconductor Field Effect Transistor (MOSFET) and a Schottky barrier diode are formed in a SiC substrate. By setting an on-start voltage of the Schottky barrier diode lower than an on-start voltage of a body diode (parasitic diode), a reflux current flow is flowed to the Schottky barrier diode to prevent flowing the reflux current to the body diode. And an on-resistance of the trench gate type MOSFET is prevented from increasing.

SUMMARY

In the semiconductor device having the trench gate type MOSFET embedded the Schottky barrier diode described above, when the counter electromotive force is low, the reflux current can flow only through the Schottky barrier diode, but when the counter electromotive force increases, the reflux current also flow through the body diode. As a result, it was found that the on-resistance of the trench gate type MOSFET increased and a reliability of the semiconductor device decreased. That is, improvement in the reliability of the semiconductor device is desired.

Other objects and novel features will become apparent from the description of this specification and the accompanying drawings.

A semiconductor device according to an embodiment includes a Schottky barrier diode region and a body diode region. In the Schottky barrier diode region, the Schottky barrier diode is formed between an n-type drift layer and a metal layer, in the body diode region, a first p-type semiconductor region, the second p-type semiconductor region, and the third p-type semiconductor region are formed in order from a main surface side in the drift layer, and in the body diode region, a body diode is formed between the third p-type semiconductor region and the drift layer. And by setting an impurity concentration of the second p-type semiconductor region to be lower than an impurity concentration of the first p-type semiconductor region and the third p-type semiconductor region, a reflux current flowing through the Schottky barrier diode is increased to prevent the reflux current flowing through the body diode.

According to the embodiment, it is possible to improve a reliability of the semiconductor device.

DETAILED DESCRIPTION

Figure 1:
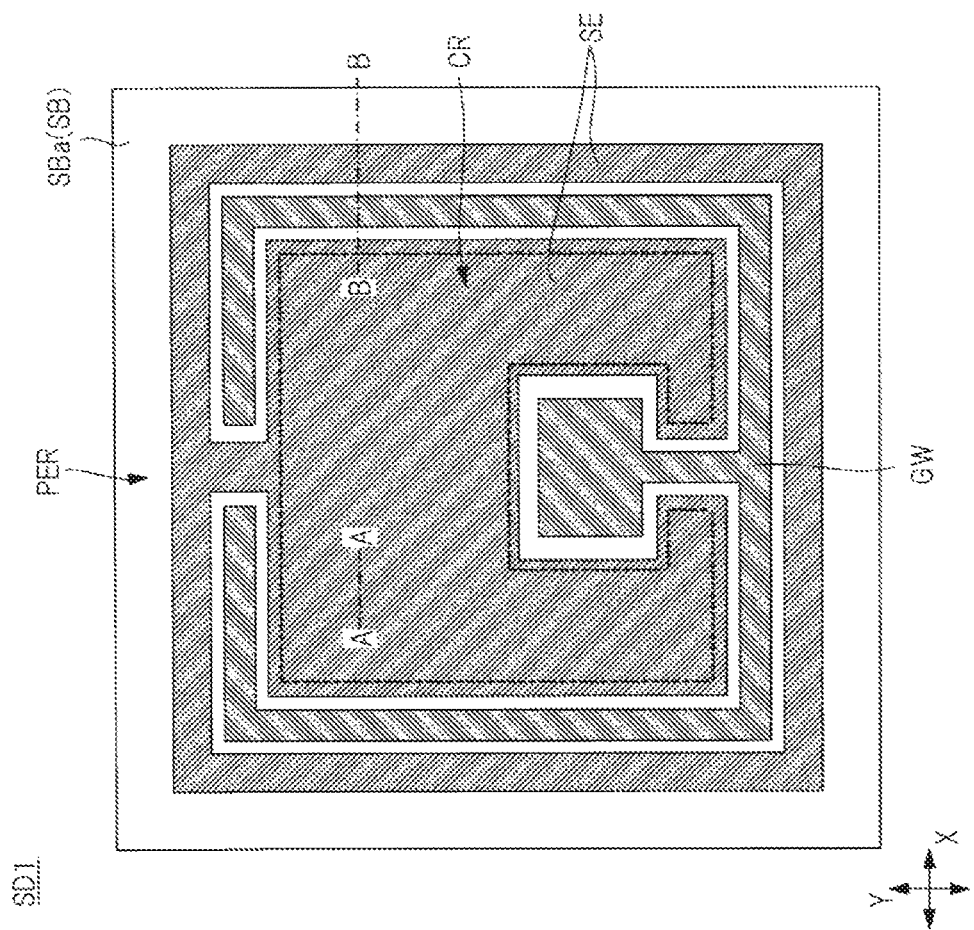
FIG. 1 is a plan view of a semiconductor device of an embodiment.

In the following embodiment, when required for convenience, the description will be made by dividing into a plurality of sections or embodiment, but except when specifically stated, they are not independent of each other, and one is related to the modified example, detail, supplementary description, or the like of part or all of the other.

In the following embodiment, the number of elements, etc. (including the number of elements, numerical values, quantities, ranges, etc.) is not limited to the specific number, but may be not less than or equal to the specific number, except for cases where the number is specifically indicated and is clearly limited to the specific number in principle.

Furthermore, in the following embodiment, it is needless to say that the constituent elements (including element steps and the like) are not necessarily essential except in the case where they are specifically specified and the case where they are considered to be obviously essential in principle.

Similarly, in the following embodiment, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

In all the drawings for explaining the embodiment, the same members are denoted by the same reference numerals in principle, and repetitive descriptions thereof are omitted. Note that even plan view may be hatched for the sake of clarity.

Explanation of an Examination Example

Figure 16:
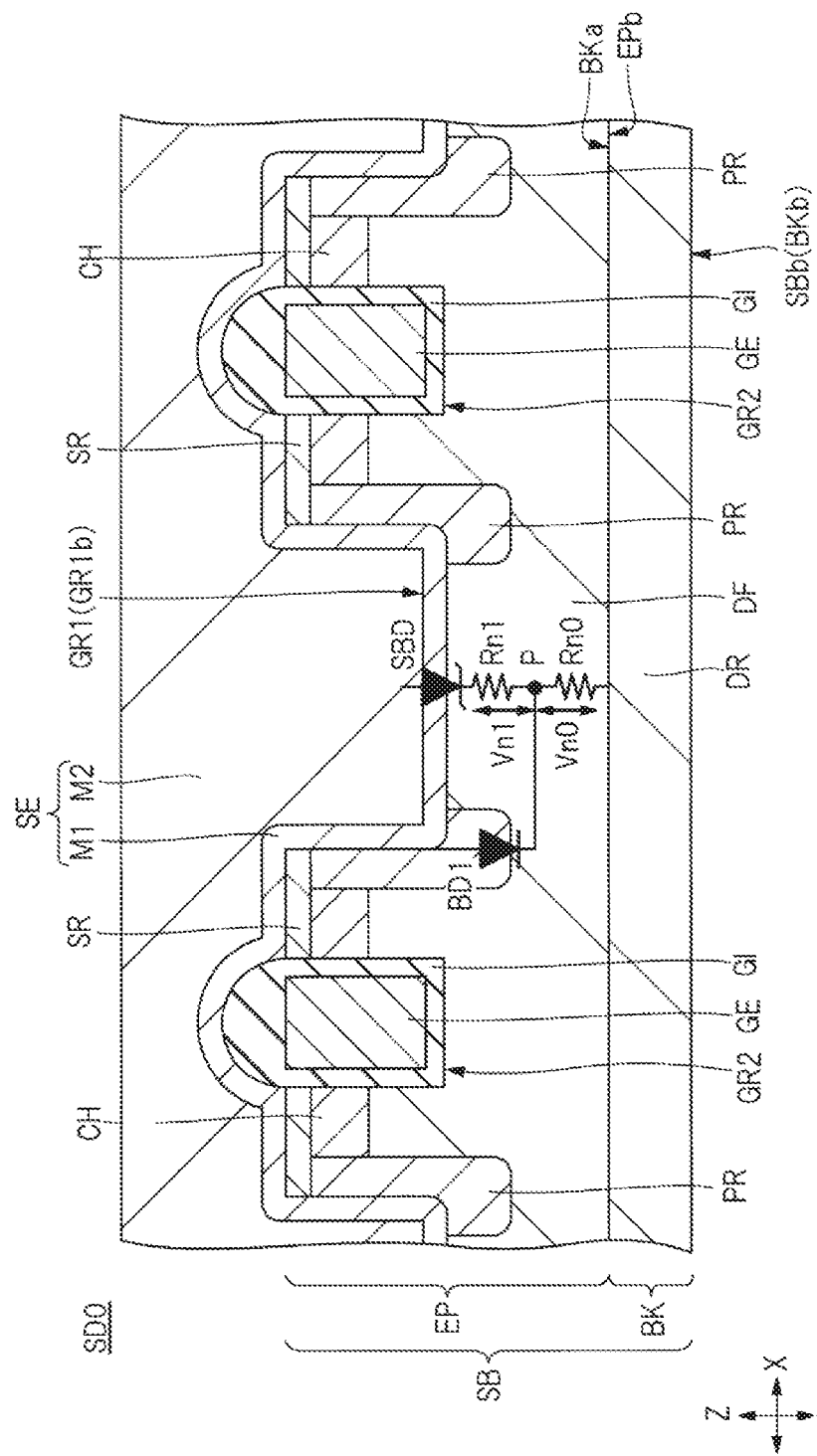
FIG. 16 is a cross-sectional view of a semiconductor device of an examined example.
Figure 17:
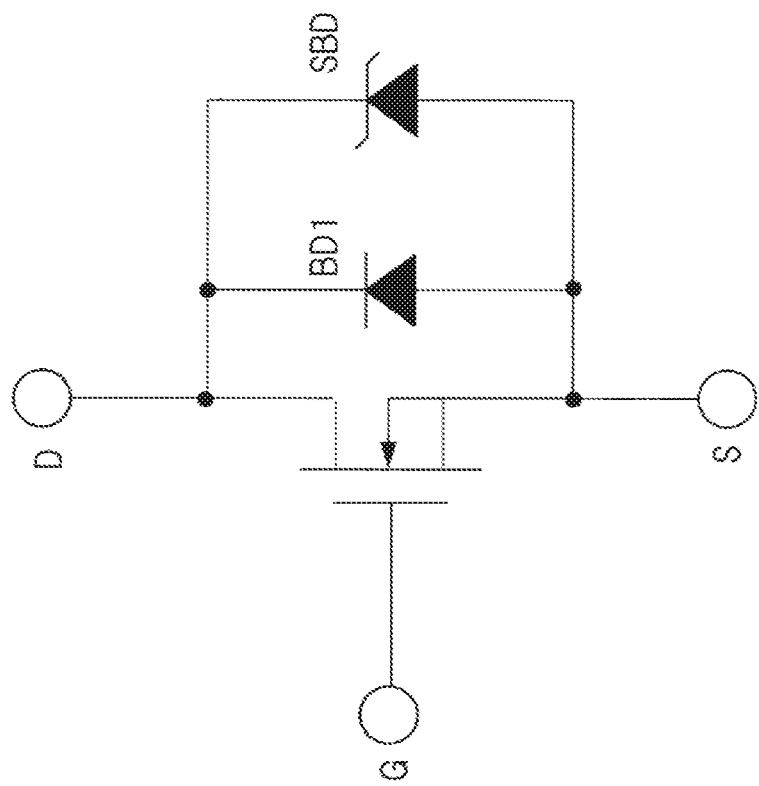
FIG. 17 is an equivalent circuit diagram of the semiconductor device of the examined example.
Figure 18:
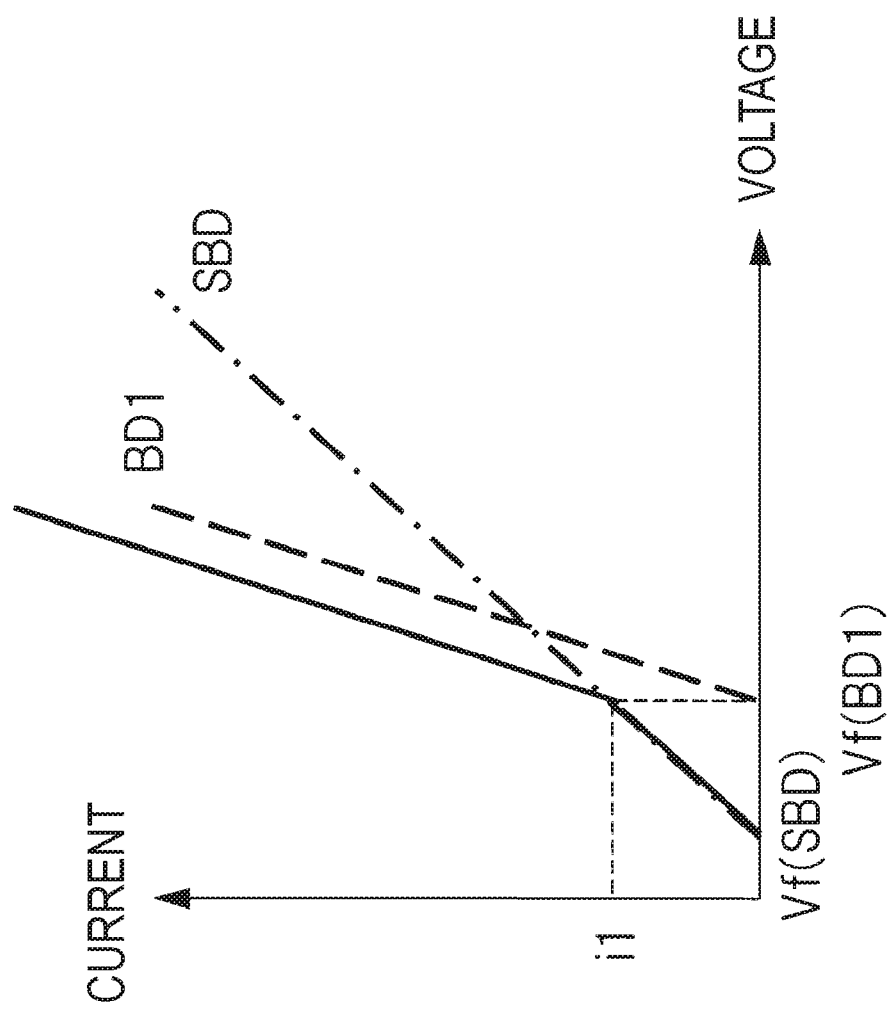
FIG. 18 is a graph showing a voltage-current characteristic of the semiconductor device of the examined example.

FIG. 16 is a cross-sectional view of a semiconductor device of an examined example, FIG. 17 is an equivalent circuit diagram of the semiconductor device of the examined example, FIG. 18 is a graph showing a voltage-current characteristic of the semiconductor device (particularly, diode) of the examined example.

As shown in FIG. 17, a trench gate type MOSFET has a drain D, a source S, and a gate G, and a Schottky barrier diode SBD and a body diode BD1 are connected in parallel between the drain D and the source S.

As shown in FIG. 16, a semiconductor device SD0 of the examined example is the trench gate type MOSFET embedded the Schottky barrier diode and is formed in a semiconductor substrate SB made of SiC. An n-type drain region DR corresponds to the drain D, an n-type source region SR corresponds to the source S, and a gate electrode GE corresponds to the gate G. A p-type channel formation region CH is formed between a drift layer DF and a source region SR, and the gate electrode GE is formed via a gate dielectric film GI in a groove GR2 that penetrates the source region SR and the channel formation region CH and reaches the drift layer DF. And, on the semiconductor substrate SB, a source electrode SE having a stack of metal layers M1 and M2 is provided, and the source electrode SE is connected to a source region SR.

A groove GR1 is provided between adjacent the gate electrodes GE, and the Schottky barrier diode is formed on a bottom surface GR1b of the groove GR1. The Schottky barrier diode includes the n-type drift layer DF and the metal layer M1 in contact with the drift layer DF, and is connected to the source electrode SE. That is, the metal layer M1 is a metal that forms Schottky junction by contacting with the n-type drift layer DF, and it is, for example, a titanium (Ti) film.

And a p-type semiconductor region PR is formed at both ends of the groove GR1, and the p-type semiconductor region PR is connected to the source electrode SE. The p-type semiconductor region PR is provided to relax an electric field between the drain region DR and the gate electrode GE when the high voltage is applied to the drain region DR, and, for example, has an impurity concentration higher than an impurity concentration of the channel formation region CH.

In the semiconductor device SD0 of the examined example, consider the case where a counter electromotive force is generated in the motor coil. That is, in the equivalent circuit diagram shown in FIG. 17, the MOSFET is off, and the high voltage is applied to the source S with respect to the drain D. As shown in FIG. 16, the drift layer DF having a relatively low concentration has resistances (parasitic resistances) Rn0 and Rn1 connected in series between the drift layer DF and the drain region DR having a relatively high concentration. Point P in the drawing corresponds to the end of the p-type semiconductor region PR on the drain region DR side. Referring to FIGS. 16 to 18, when the high voltage is applied to the source electrode SE, the Schottky barrier diode is turned on by an on-start voltage Vf of the Schottky barrier diode, and a current flows from the source electrode SE to the drain region DR through the Schottky barrier diode. And when the current increases to a current value i1 and a divided voltage Vn1 on the resistance Rn1 side becomes equal to or higher than the on-start voltage Vf (BD1) of the body diode BD1, the current flows from the source electrode SE to the drain region DR via the body diode BD1, so that the current between the source electrode SE and the drain region DR increases as shown in FIG. 18. Here, when current flows through the drift layer DF via the body diode BD1, holes are injected from the p-type semiconductor region PR into the drift layer DF. And, the injected holes recombine with electronics which are majority carrier of the drift layer DF, and crystal defects (transitions) existing in the drift layer DF are expanded by recombination energy. Therefore, a leakage current of the trench gate type MOSFET increases and the on-resistance increases.

<Structure of a Semiconductor Device>

Figure 2:
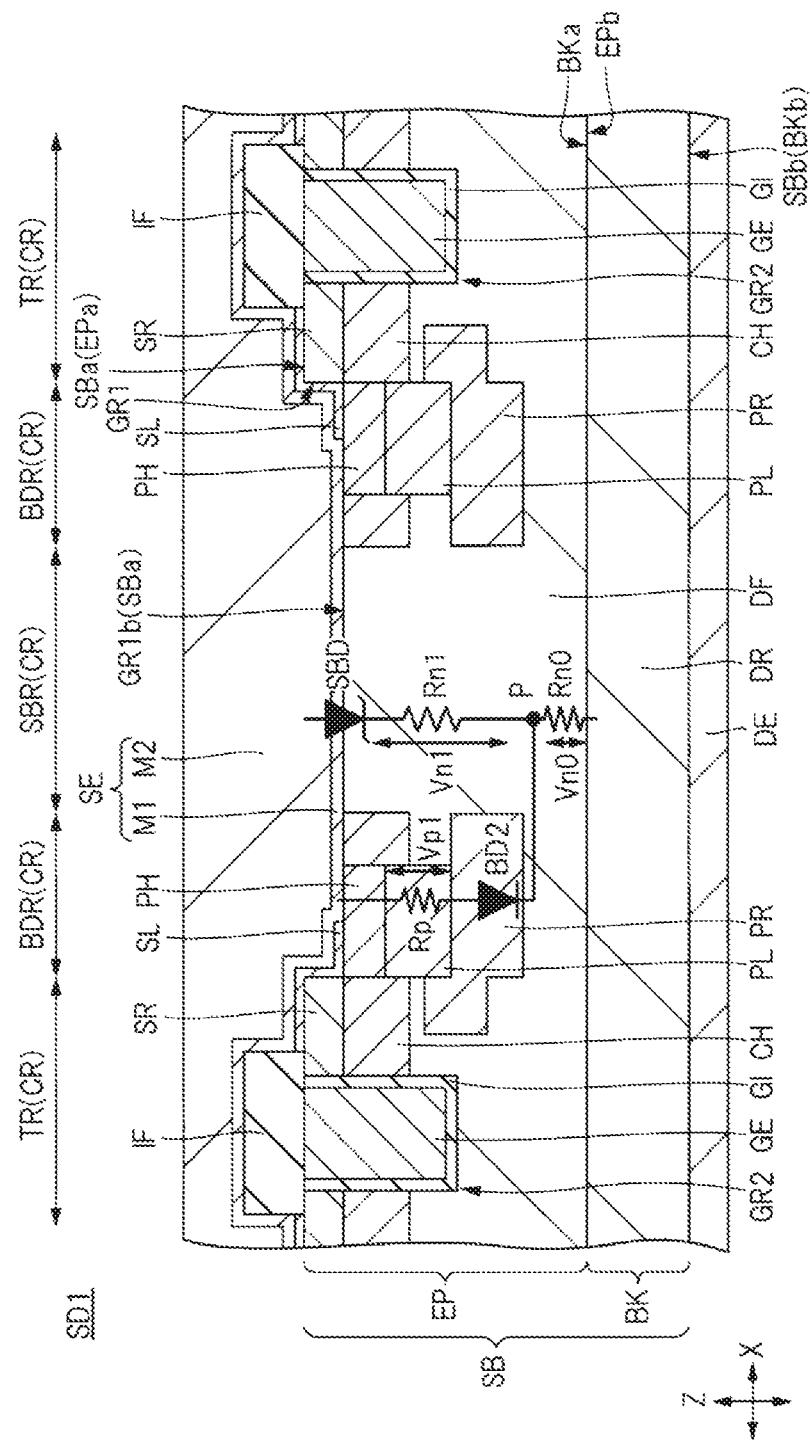
FIG. 2 is a cross-sectional view taken along an A-A line of FIG. 1.
Figure 3:
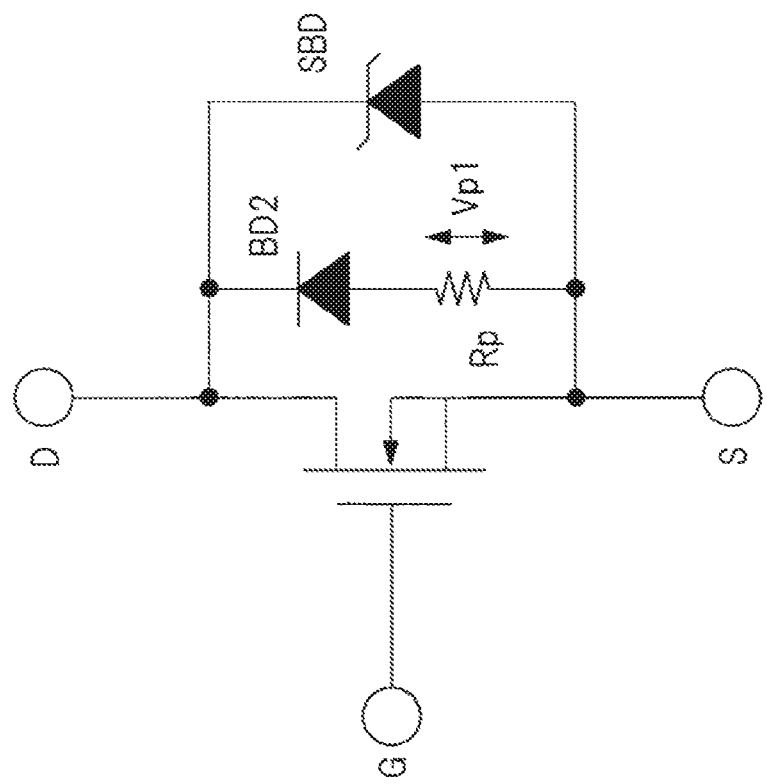
FIG. 3 is an equivalent circuit diagram of the semiconductor device of the embodiment.
Figure 4:
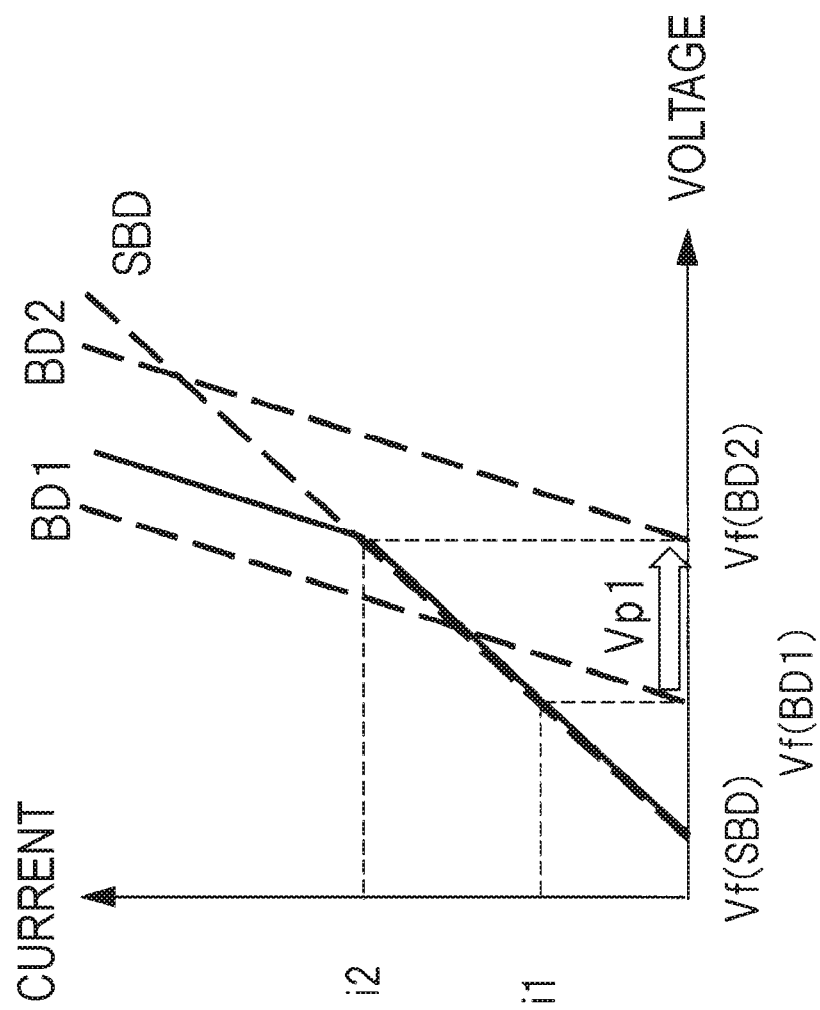
FIG. 4 is a graph showing a voltage-current characteristic of the semiconductor device of the embodiment.
Figure 5:
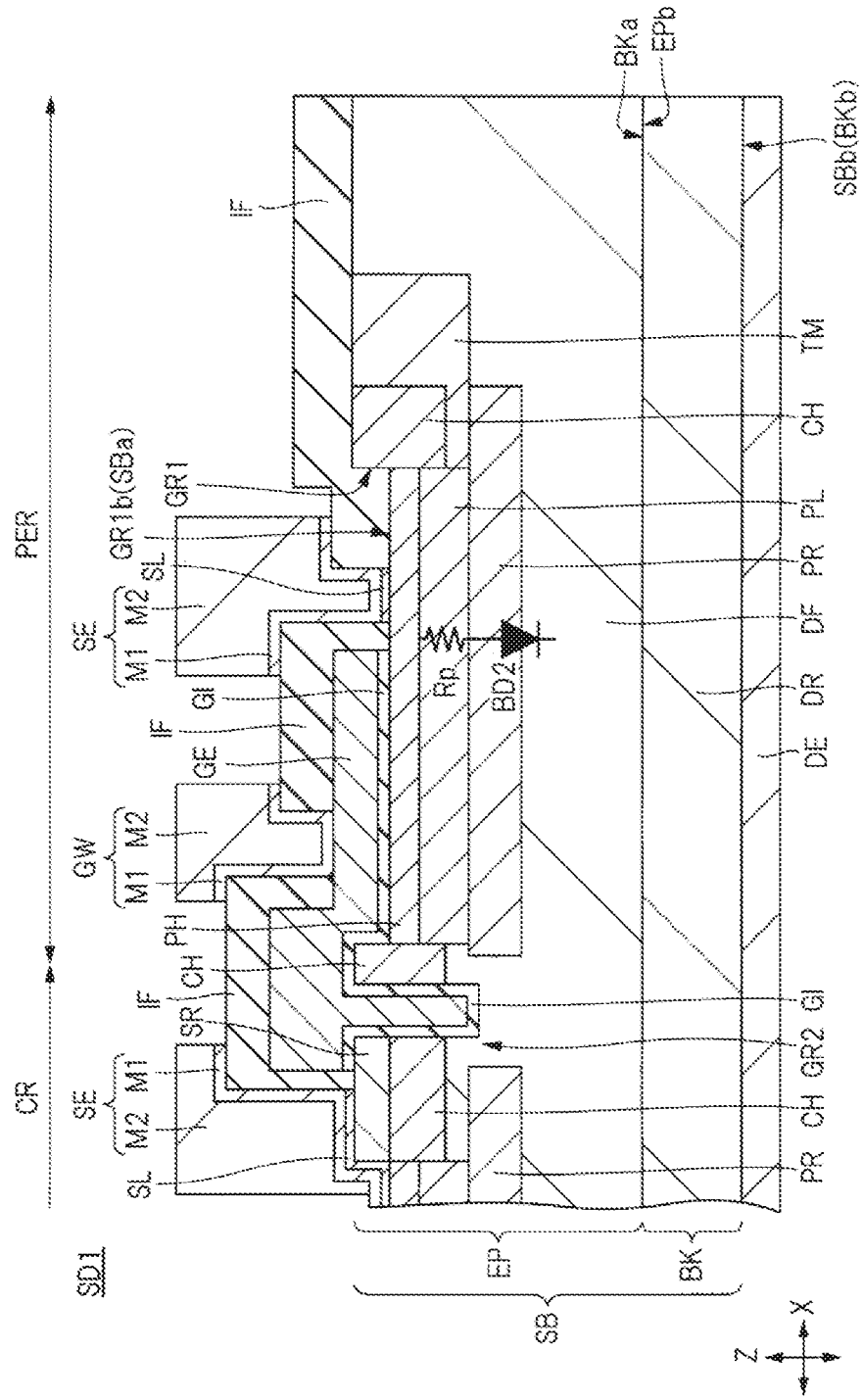
FIG. 5 is a cross-sectional view taken along a B-B line in FIG. 1.

FIG. 1 is a plan view of a semiconductor device SD1 of an embodiment, FIG. 2 is a cross-sectional view taken along a line A-A of FIG. 1, FIG. 3 is an equivalent circuit diagram of the semiconductor device of the embodiment, FIG. 4 is a graph showing voltage-current characteristic of the semiconductor device (in particular, diode) of the embodiment, and FIG. 5 is a cross-sectional view taken along a line B-B of FIG. 1.

As shown in FIG. 1, a semiconductor device SD1 has a cell region CR arranged at a center of a main surface SBa of a semiconductor substrate SB, and a peripheral region PER arranged so as to surround a periphery of the cell region CR. A source electrode SE has a first portion covering the cell region CR and a second portion annularly arranged in the peripheral region PER, and the source electrode SE is connected to the first portion and the second portion. A gate wiring GW has substantially annular shape (C-shape) and is arranged between the first portion of the source electrode and the second portion of the source electrode, and surrounds the cell region CR. In FIG. 1, a direction taken along the cutting line A-A and B-B is defined as an X direction, and a direction orthogonal to the X direction is defined as a Y direction.

As shown in FIG. 3, a trench gate type MOSFET has a drain D, a source S, and a gate G, and between the drain D and the source S, a Schottky barrier diode, a body diode BD2 and a resistance Rp connected in series are connected in parallel.

As shown in FIG. 2, a semiconductor device SD1 of the embodiment is the trench gate type MOSFET embedded the Schottky barrier diode and is formed in the semiconductor substrate SB made of SiC. The main surface SBa of the semiconductor substrate SB includes a transistor region TR which is a formation region of the trench gate type MOSFET, a body diode region BDR which is a formation region of the body diode BD1, and a Schottky barrier diode region SBR which is a formation region of the Schottky barrier diode. The cell region CR includes a plurality of transistor regions TR, body diode regions BDR, and Schottky barrier diode regions SBR. The Schottky barrier diode region SBR is arranged between two adjacent transistor regions TR, and the body diode region BDR is arranged between the transistor region TR and the Schottky barrier diode region SBR. The transistor region TR, the body diode region BDR, and the Schottky barrier diode region SBR are repeatedly arranged in the X direction. When a range from a center of the gate electrode GE to a center of the adjacent gate electrode GE in the X direction is defined as one cell, a plurality of cells is repeatedly arranged in the X direction. In addition, a thickness direction of the semiconductor substrate SB is defined as a Z direction.

The semiconductor substrate SB has a laminated structure of a substrate (bulk substrate, semiconductor layer) BK made of SiC containing n-type impurities and an epitaxial layer (semiconductor layer) EP made of SiC containing n-type impurities. The substrate BK has a main surface (first main surface) BKa and a back surface (second main surface) BKb opposite to the main surface BKa, and the epitaxial layer EP has a main surface (first main surface) EPa and a back surface (second main surface) EPb opposite to the main surface EPa. The substrate BK is provided on the back surface EPb of the epitaxial layer EP. The back surface EPb of the epitaxial layer EP contacts the main surface BKa of the substrate BK, the main surface EPa of the epitaxial layer EP coincides with the main surface (first main surface) SBa of the semiconductor substrate SB, and the back surface BKb of the substrate BK coincides with the back surface SBb of the semiconductor substrate SB. The impurity concentration of the substrate BK is, for example, $1\times10^{18}/cm^3 \sim 1\times10^{21}/cm^3$, the impurity concentration of the epitaxial layer EP is, for example, $1\times10^{15}/cm^3 \sim 1\times10^{17}/cm^3$, preferably $1\times10^{16}/cm^3$, and the n-type impurity concentration of the epitaxial layer EP is lower than the n-type impurity concentration of the substrate BK. Although a thickness of the epitaxial layer EP depends on a withstand voltage permitted by the semiconductor device SD1, for example, it is about 12 μm.

An n-type drain region DR corresponds to the drain D, an n-type source region SR corresponds to the source S, and a gate electrode GE corresponds to the gate G (see FIG. 3). In the transistor region TR, the trench gate type MOSFET is configured by the drain region DR, the drift layer DF, a channel formation region CH, the source region SR, the gate electrode GE, and a gate dielectric film electrode GI. The source region SR is formed in the semiconductor substrate SB (or the epitaxial layer EP) so that the source region SR is exposed to the main surface SBa (or the main surface EPa) of the semiconductor substrate SB (or the epitaxial layer EP). An impurity concentration of the source region SR is, for example, about $2\times10^{20}/cm^3$ in peak concentration at a depth of 0.3 μm from the main surface SBa. The p-type channel formation region CH is formed on the back surface SBb of the semiconductor substrate SB with respect to the source region SR and contacts the source region SR and the drift layer DF. The channel region CH is arranged between the source region SR and the drift layer DF. The impurity concentration of the channel formation regions CH is, for example, about $3\times10^{17}/cm^3$ in peak concentration at a depth of 0.8 μm from the main surface SBa.

On the main surface SBa of the semiconductor substrate SB, a plurality of grooves GR2 are arranged at predetermined interval in the X-direction. In the Z-direction, the groove GR2 passes through the source region SR and the channel formation region CH to reach the drift layer DF. Precisely, the groove GR2 bites into the drift layer DF and is also formed inside the drift layer DF. A depth of the groove GR2 is, for example, 1.2 μm from the main surface SBa. The main surface SBa serving as a reference of the depth is the main surface SBa in the region where the source region SR is formed. The gate dielectric film GI is formed on a side surface and a bottom surface of the groove GR2, and the gate electrode GE is formed on the gate dielectric film GI. The gate dielectric film GI is, for example, a silicon oxynitride film, and the gate electrode GE is, for example, a polysilicon film. The gate electrode GE is covered an interlayer insulating film IF and insulated from a source electrode SE formed on the interlayer insulating film IF. On the other hand, the source electrode SE is electrically connected to the source region SR. The source electrode SE is in ohmic contact with the source region SR via a silicide layer SL. And the source electrode SE has a stacked structure of a metal layer M1 and a metal layer M2 formed on the metal layer M1.

In the body diode region BDR, a p-type semiconductor region PH, a p-type semiconductor region PL and a p-type semiconductor region PR are formed in the drift layer DF. The p-type semiconductor region PH is formed so as to be exposed on the main surface SBa side of the semiconductor substrate SB, the p-type semiconductor region PR is formed on the back surface EPb side of the epitaxial layer EP (in other words, the drift layer DF) with respect to the p-type semiconductor region PH, and the p-type semiconductor region PL is formed between the p-type semiconductor regions PH and PR.

The p-type semiconductor region PH is a semiconductor region having a relatively high concentration, and an impurity concentration of the p-type semiconductor region PH is, for example, about $2\times10^{20}/cm^3$. The source electrode SE is electrically connected to the p-type semiconductor region PH, and is in ohmic contact with the p-type semiconductor region PH via the silicide layer SL. The channel formation region CH formed in the transistor region TR extends to the body diode region BDR and overlaps with the p-type semiconductor region PH. That is, the p-type semiconductor region PH is provided to connect the channel formation region CH to the source electrode SE.

The p-type semiconductor region PR is provided to relax an electric field between the drain region DR and the gate electrode GE when a high voltage is applied to the drain region DR, for example, the p-type semiconductor region PR has a concentration higher than that of the channel formation region CH. The p-type semiconductor region PR is provided at a position deeper than the groove GR2, a depth of the p-type semiconductor region PR is about 2.3 μm, and a peak concentration of the impurity is, for example, about $1\times10^{18}/cm^3$. The p-type semiconductor region PR formed in the body diode region BDR is not formed in the transistor region TR and the Schottky barrier diode region SBR and is separated from each other in the X direction. However, as shown in FIG. 2, a portion of the p-type semiconductor region PR extends to the transistor region TR. The body diode BD2 described later is formed between the p-type semiconductor region PR and the drift layer DF.

The p-type semiconductor region PL is provided between the p-type semiconductor regions PH and PR in the depth direction (Z direction), and its impurity concentration is lower than that of the p-type semiconductor regions PH and PR. In the Z direction, the p-type semiconductor region PL overlaps with the channel formation region CH in a relatively shallow portion and does not overlap with the channel formation region CH in a relatively deep portion. The portion that does not overlap with the channel formation region CH is a portion that overlaps with the drift layer DF between the channel formation region CH and the p-type semiconductor region PR in the Z direction. The p-type semiconductor region PL preferably has an impurity concentration of, for example, $1 \times 10^{17}/cm^3$ or less in a portion which does not overlap with the channel formation region CH (a relatively deep portion), and, in this portion, the impurity concentration of the p-type semiconductor region PL is lower than that of the channel formation region CH. The impurity concentration of a portion overlapping the channel formation region CH (relatively shallow portion) is about $4 \times 10^{17}/cm^3$, which is a sum of an impurity concentration of the channel formation region CH and an impurity concentration of the p-type semiconductor region PL. As will be described later, the p-type semiconductor region PL functions as a resistance (parasitic resistance) Rp when current flows through the body diode BD2.

In the Schottky barrier diode region SBR, the drift layer DF is exposed to the main surface SBa of the semiconductor substrate SB, and the source electrode SE contacts the drift layer DF. In other words, the metal layer M1 constituting the source electrode SE is in contact with the drift layer DF to form Schottky junction. That is, the Schottky barrier diode is formed between the source electrode SE and the drift layer DF. The metal layer M1 is made of a metal having a work function larger than that of an n-type semiconductor region constituting the drift layer DF, for example, titanium (Ti), nickel (Ni), molybdenum (Mo), aluminum (Al), gold (Au), or platinum (Pt). And, the metal layer M2 is formed of a metal film containing aluminum (Al) as a main component and may contain a trace amount of silicon (Si), copper (Cu), or both as impurities. And, a metal layer to be a barrier layer may be interposed between the metal layers M1 and M2, for example, titanium nitride (TiN) or the like can be used as the barrier layer.

In addition, in this embodiment, in the body diode region BDR and the Schottky barrier diode region SBR, a groove GR1 is formed in the main surface SBa of the semiconductor substrate SB in order to remove the source region SR, and a depth of the groove GR1 is larger than a thickness of the source region SR. And in the body diode region BDR and the Schottky barrier diode region SBR, a bottom surface (a bottom portion) GR1b of the groove GR1 coincides with the main surface SBa of the semiconductor substrate SB. That is, the main surface SBa of the semiconductor substrate SB has, for example, two surfaces having different heights as a reference of the back surface EPb of the epitaxial layer EP.

In addition, a drain electrode DE is formed on the back surface SBb of the semiconductor substrate SB, and the drain electrode DE is formed of, for example, a stack structure of nickel silicide (NiSi), titanium (Ti) and gold (Au) in order from a side contacting the substrate BK.

Next, as in the examined example, considered a counter electromotive force is generated in the above described motor coil in the semiconductor device SD1. That is, in the equivalent circuit diagram shown in FIG. 3, a high voltage is applied to the source S with respect to the drain D. Unlike examined example, in this embodiment, as shown in FIGS. 2 and 3, a resistance (parasitic resistance) Rp connected in series with the body diode BD2 is provided between the source S and the drain D. The resistance Rp corresponds to the semiconductor region PL shown in FIG. 2. Referring to FIGS. 2 to 4, the drift layer DF having a relatively low concentration has resistances (parasitic resistance) Rn0 and Rn1 connected in series between the drift layer DF and the drain region DR having a relatively high concentration. Point P in the drawing corresponds to an end of the p-type semiconductor region PR on the drain region DR side in the Schottky barrier diode region SBR. When a high voltage is applied to the source electrode SE, the Schottky barrier diode is turned on by an on-start voltage Vf (Schottky barrier diode) of the Schottky barrier diode, and current flows from the source electrode SE to the drain region DR through the Schottky barrier diode. When a voltage dividing Vn1 on a resistance Rn1 side becomes equal to or larger than a sum of a voltage Vp1 applied to the resistance Rp and the on-start voltage Vf (BD2) of the body diode BD2, since the current flows from the source electrode SE to the drain region DR through the body diode BD2, the current between the source electrode SE and the drain region DR increases.

In this embodiment, since there is a resistance Rp connected in series with the body diode BD2, the on-start voltage Vf (BD2) of the body diode BD2 can be increased by the voltage Vp1 applied to the resistance Rp more than the on-start voltage Vf (BD1) of the body diode BD1 of the examined example. That is, compared with the examined example, the current flows through the Schottky barrier diode can be increased to the current value i2 without turning on the body diode BD2. Therefore, it is possible to increase a reflux current of the trench gate type MOSFET without causing the problems such as an increase in a leakage current of the trench gate type MOSFET and an increase in an on-resistance. That is, a reliability of the semiconductor device can be improved.

FIG. 5 shows a peripheral area PER of the semiconductor device SD1. The peripheral region PER has a structure similar to that of the body diode region BDR. That is, the p-type semiconductor region PH is formed so as to be exposed to the main surface SBa of the semiconductor substrate SB, the p-type semiconductor region PR is formed on the back surface EPb side of the epitaxial layer EP (in other words, the drift layer DF) with respect to the p-type semiconductor region PH, and the p-type semiconductor region PL is formed between the p-type semiconductor regions PH and PR. Further, the p-type semiconductor regions PH, PL, and PR are electrically connected to the source electrode SE. Further, the channel formation region CH and the p-type termination region TM are provided outside the p-type semiconductor region PH (on the side opposite to the cell region CR). The termination region TM is provided to relax an electric field applied to the p-type semiconductor region PR and the channel formation region CH, and an impurity concentration of the termination region TM is preferable lower than the impurity concentration of the channel formation region CH and that of the P-type semiconductor region PR.

Also in the peripheral region PER, since the body diode BD2 is formed between the p-type semiconductor region PR and the drift layer DF, by interposing the p-type semiconductor region PL between the p-type semiconductor regions PH and PR, the reflux current through the Schottky barrier diode can be increased to the current value i2 without turning on the body diode BD2.

<Manufacturing Method of the Semiconductor Device>

Next, a manufacturing method of the semiconductor device in this embodiment will be described with reference to FIGS. 2 and 6 to 15. FIGS. 6 to 15 are cross-sectional view showing a manufacturing method of the semiconductor device of this embodiment and these are corresponded to the cross-sectional view of FIG. 2.

Figure 6:
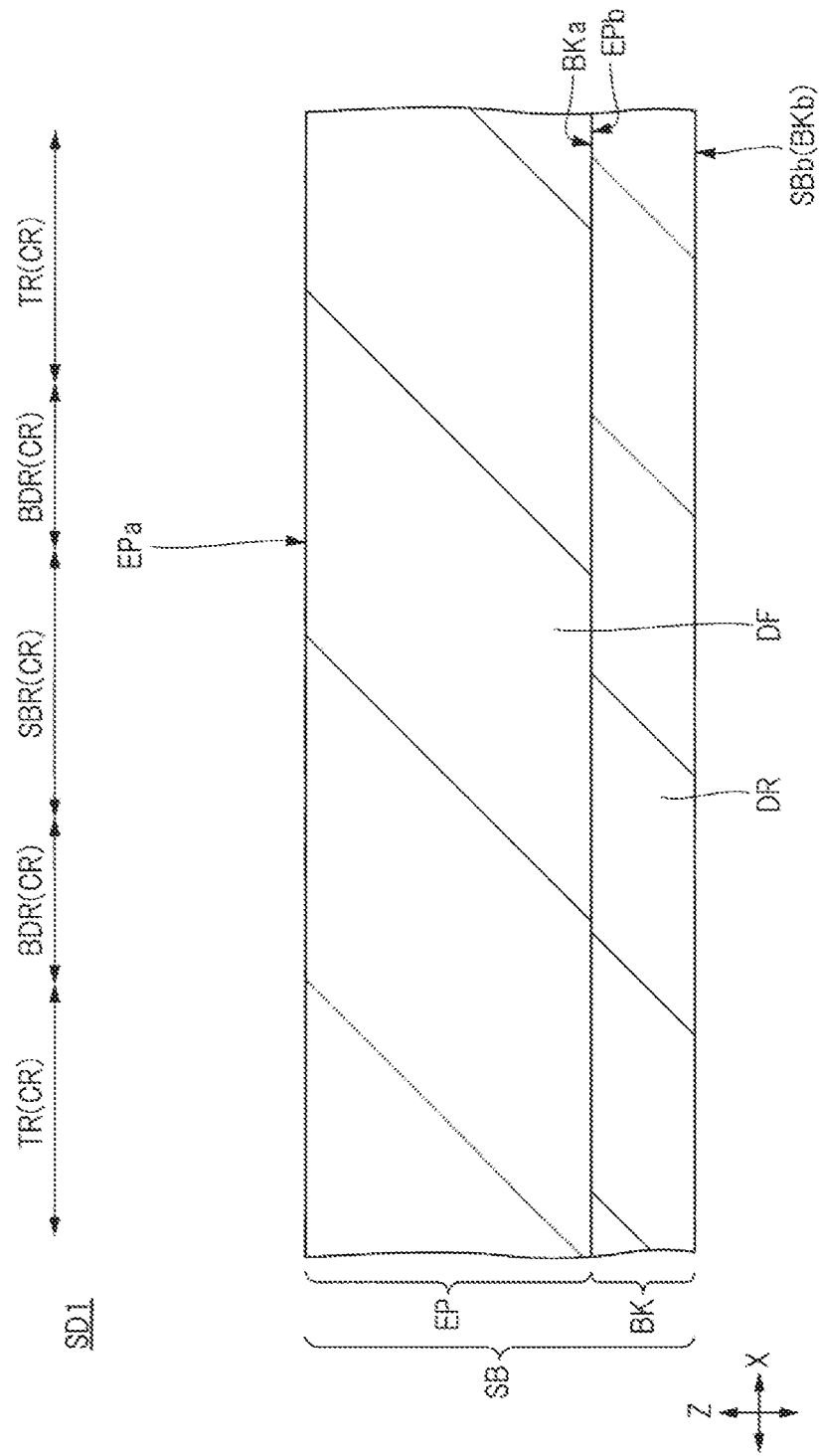
FIG. 6 is a cross-sectional view in a manufacturing step of the semiconductor device in the embodiment.

FIG. 6 shows a providing step of a semiconductor substrate SB, and the providing step of the semiconductor substrate SB includes a providing step of a substrate BK and a forming step of an epitaxial layer EP. First, the substrate BK made of an n-type silicon carbide is provided. The substrate BK is doped with n-type impurities at relatively high concentration. The n-type impurity is, for example, nitrogen (N) or phosphorus (P), and an impurity concentration thereof is, for example, about $1 \times 10^{19}/cm^3$.

Next, the epitaxial layer EP made of SiC is formed on a main surface BKa of the substrate BK by an epitaxial growth method. The epitaxial layer EP contain n-type impurities at impurity concentration lower than that of substrate BK. The impurity concentration of the epitaxial layer EP depends on a withstand voltage of the semiconductor device SD1, and the impurity concentration of the epitaxial layer EP is, for example, about $1 \times 10^{16}/cm^3$. The epitaxial layer EP serves as a path for a current flowing in the Z-direction in the trench gate type MOSFET. That is, the substrate BK is a drain region DR of the semiconductor device SD1, and the epitaxial layer EP is a drift layer DF of the semiconductor device SD1. Thus, the semiconductor substrate SB configured the substrate BK and the epitaxial layers EP is provided.

Figure 7:
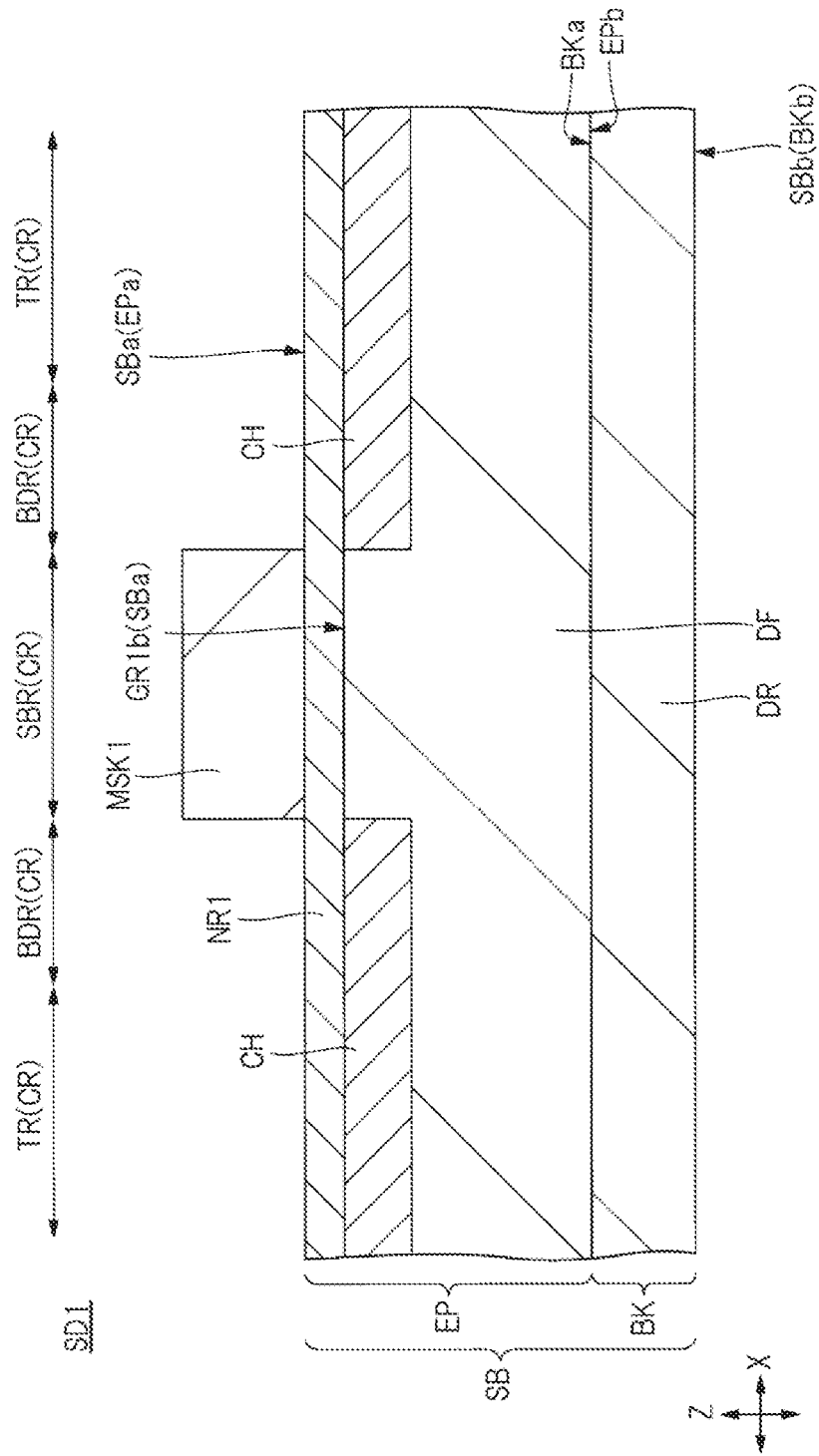
FIG. 7 is a cross-sectional view in a manufacturing step of the semiconductor device in the embodiment.

FIG. 7 shows a step of forming an n-type semiconductor region NR1 and a step of forming a channel formation region CH. First, n-type impurity ions (for example, nitrogen (N) or phosphorus (P)) are implanted into a main surface SBa of the semiconductor substrate SB to form the n-type semiconductor regions NR1. The n-type semiconductor region NR1 is formed in a transistor region TR, a body diode region BDR, and a Schottky barrier diode region SBR. An impurity concentration of the n-type semiconductor region NR1 is, for example, about $1 \times 10^{20}/cm^3$ in peak concentration at a depth of 0.3 μm from the main surface SBa.

Next, as shown in FIG. 7, a mask film MSK1 covering the Schottky barrier diode region SBR is provided on the main surface SBa, and p-type impurities (for example, boron (B) or aluminum (Al)) are ion-implanted into the transistor region TR and the body diode region BDR exposed from the mask film MSK1 to form the channel formation region CH. An impurity concentration of the channel formation regions CH is about $3 \times 10^{17}/cm^3$ at a depth of 0.8 μm from the main surface SBa. After the ion implantation step is completed, the mask film MSK1 is removed. Note that the mask film MSK1 can be a photoresist film, a silicon oxide film, a silicon nitride film, or the like. The same applies to a following mask films MSK2-MSK8. In addition, although the channel formation region CH is formed following the n-type semiconductor region NR1, the forming step of the both may be reversed.

Figure 8:
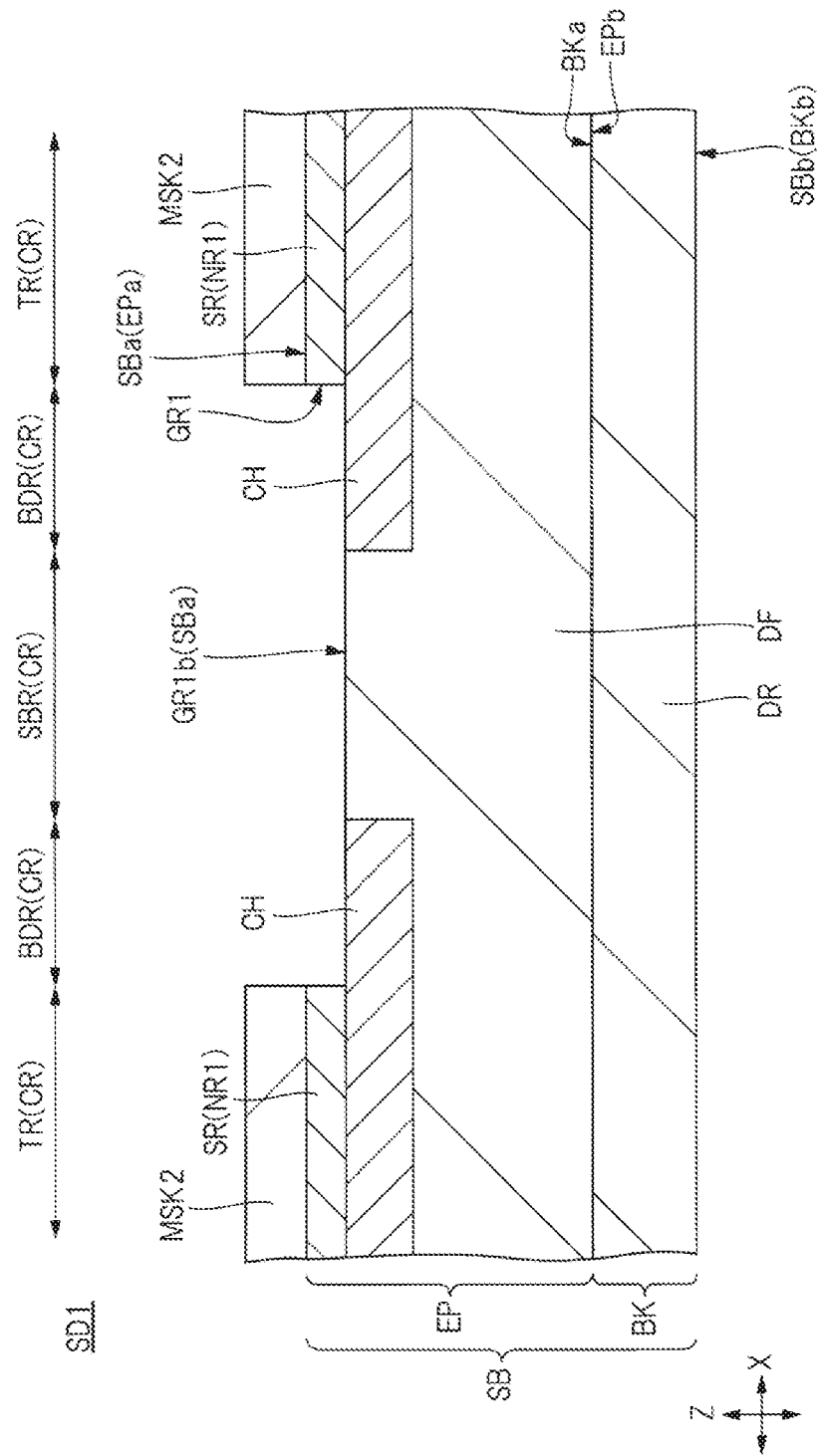
FIG. 8 is a cross-sectional view in a manufacturing step of the semiconductor device in the embodiment.

FIG. 8 shows a step of forming a source region SR. A mask film MSK2 covering the transistor region TR and exposing the body diode region BDR and the Schottky barrier diode region SBR is provided on the main surface SBa. The semiconductor substrate SB is performed by dry-etching to form a groove GR1 in a region exposed from the mask film MSK2, thereby removing the n-type semiconductor region NR1 in the body diode region BDR and the Schottky barrier diode region SBR to form the source region SR in the transistor region TR. In order to completely remove the n-type semiconductor region NR1 in the body diode region BDR and the Schottky barrier diode region SBR, it is important that the depth of the groove GR1 is deeper than the thickness of the n-type semiconductor region NR1. After the dry-etching step is completed, the mask film MSK2 is removed.

Figure 9:
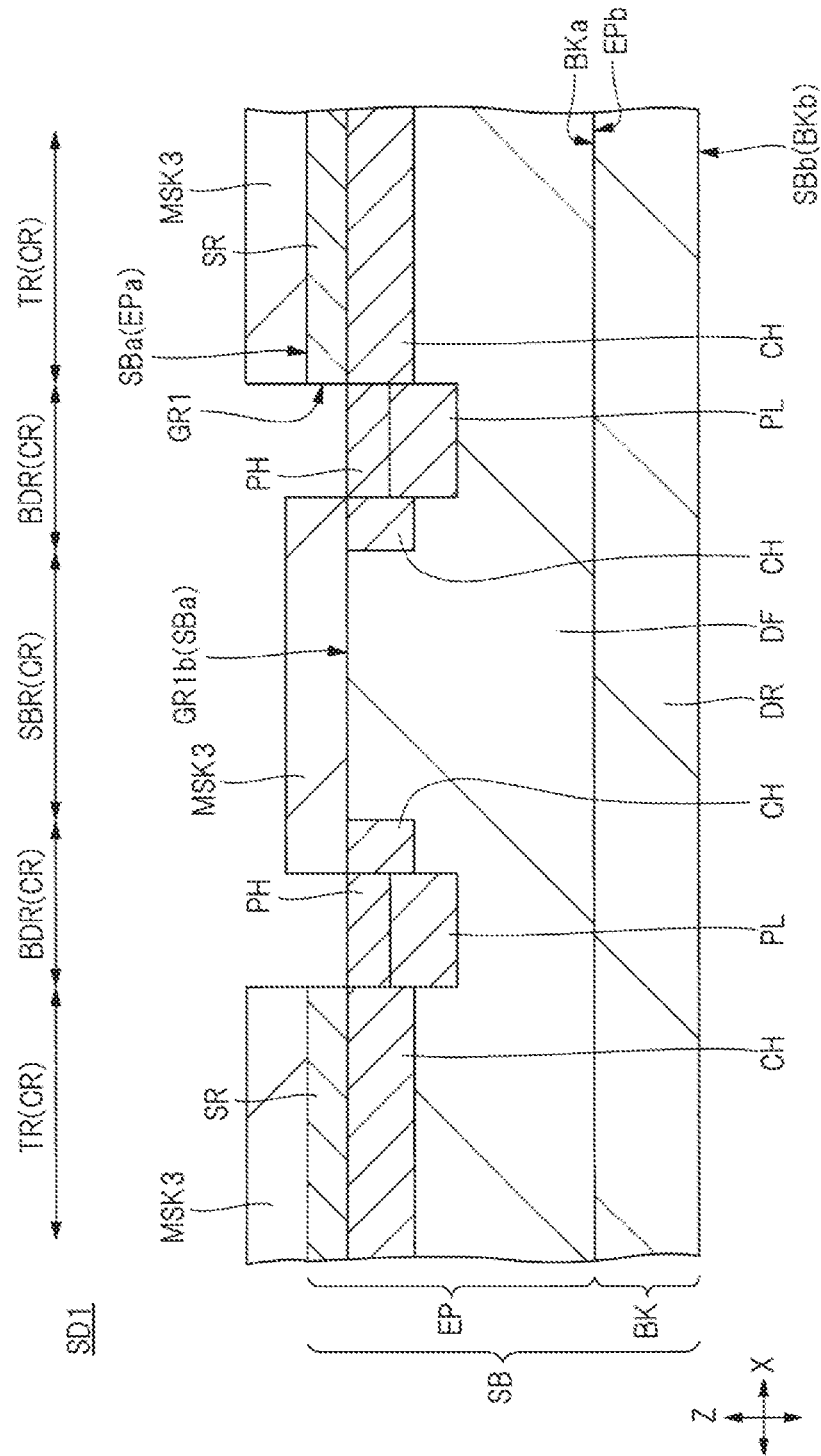
FIG. 9 is a cross-sectional view in a manufacturing step of the semiconductor device in the embodiment.

FIG. 9 shows a step of forming a p-type semiconductor region PH and a step of forming a p-type semiconductor region PL. On the main surface SBa, a mask film MSK3 is provided which covers a part of the transistor region TR, the Schottky barrier diode region SBR, and the body diode region BDR and exposes the other part of the body diode region BDR, and p-type impurity ions are implanted into a region exposed from the mask film MSK3 to form the p-type semiconductor region PH. The peak concentration of the p-type semiconductor region PH is about $2 \times 10^{20}/cm^3$. The p-type semiconductor region PH is formed so that the p-type semiconductor region PH is exposed on the main surface SBa (in other words, a bottom surface GR1b of a groove GR1). Next, n-type impurities are ion-implanted into a region exposed from the mask film MSK3 to form the p-type semiconductor region PL having a peak density of $1 \times 10^{17}/cm^3$ or less at a tail portion of the p-type semiconductor region PH. The p-type semiconductor region PL contacts the p-type semiconductor region PH and is formed on a back surface EPb side of the epitaxial layer EP (in other words, the drift layer DF) with respect to the p-type semiconductor region PH. After the ion implantation step is completed, the mask film MSK3 is removed.

Note that although the p-type semiconductor region PL is formed by ion implantation of n-type impurities, the p-type semiconductor region PH may be formed thinly, and the p-type semiconductor region PL may be formed by p-type impurities are ion-implanted below the p-type semiconductor region PH.

Figure 10:
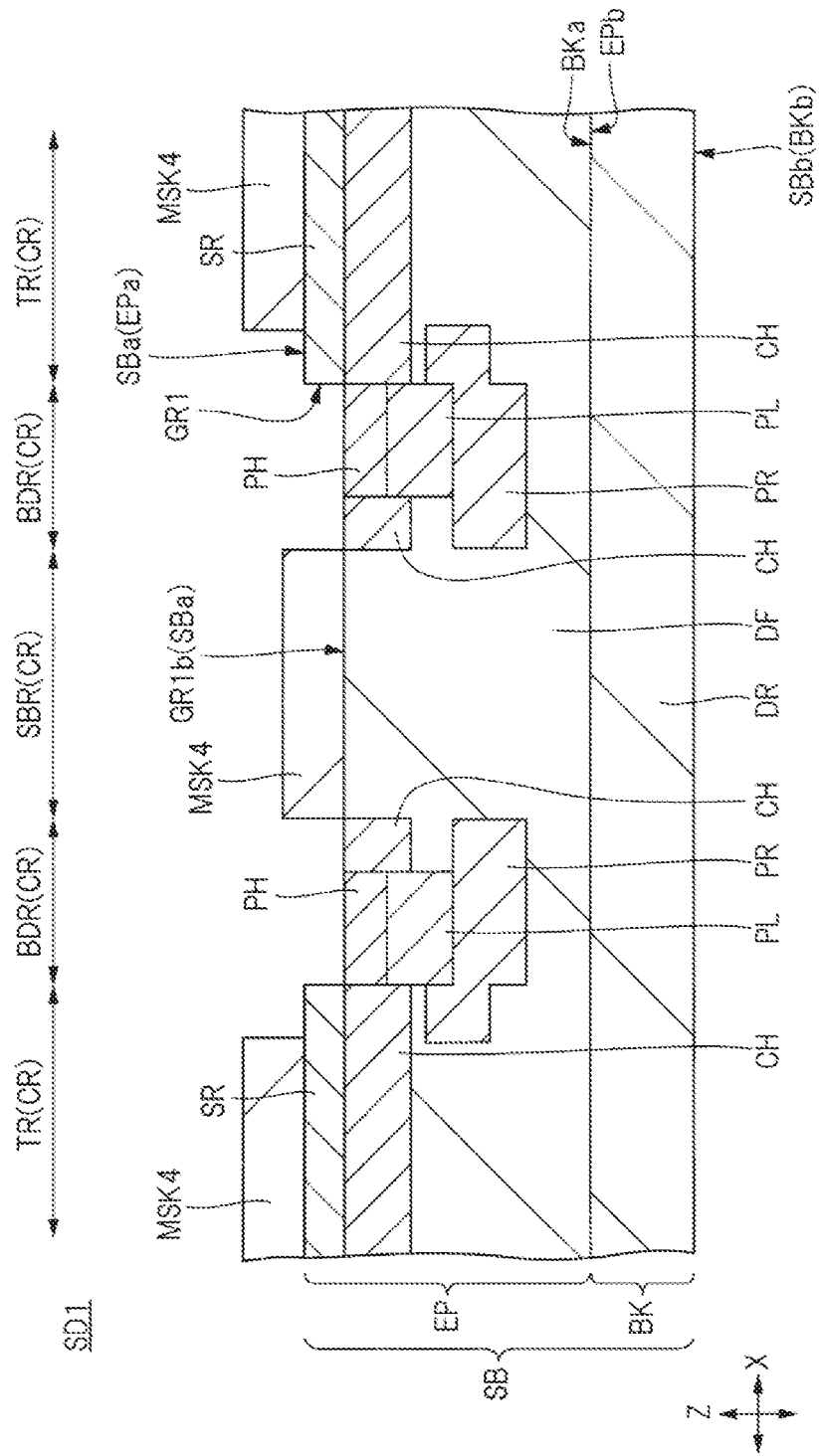
FIG. 10 is a cross-sectional view in a manufacturing step of the semiconductor device in the embodiment.

FIG. 10 shows a step of forming a p-type semiconductor region PR. A mask film MSK4 covering a part of the transistor region TR and the Schottky barrier diode region SBR and exposing the other part of the transistor region TR and the body diode region BDR is provided on the main surface SBa, and p-type impurity ions are implanted into a region exposed from the mask film MSK4 to form a p-type semiconductor region PR. The p-type semiconductor region PR is formed away from the channel formation region CH in the Z-direction, and an impurity concentration of the p-type semiconductor region PR is, for example, about $1 \times 10^{18}/cm^3$ at a depth of 2.3 μm. The p-type semiconductor region PR contacts the p-type semiconductor region PL and is formed on the back surface EPb side of the epitaxial layer EP (in other words, the drift layer DF) with respect to the p-type semiconductor region PL.

Next, after the mask film MK4 is removed, entire of the main surface SBa of the semiconductor substrate SB is covered with a protective film (for example, an amorphous carbon film), and the semiconductor substrate SB is annealed at a high temperature (for example, 1700° C.) to activate the ion-implantation impurities. After the annealing process is completed, the protective film is removed.

Figure 11:
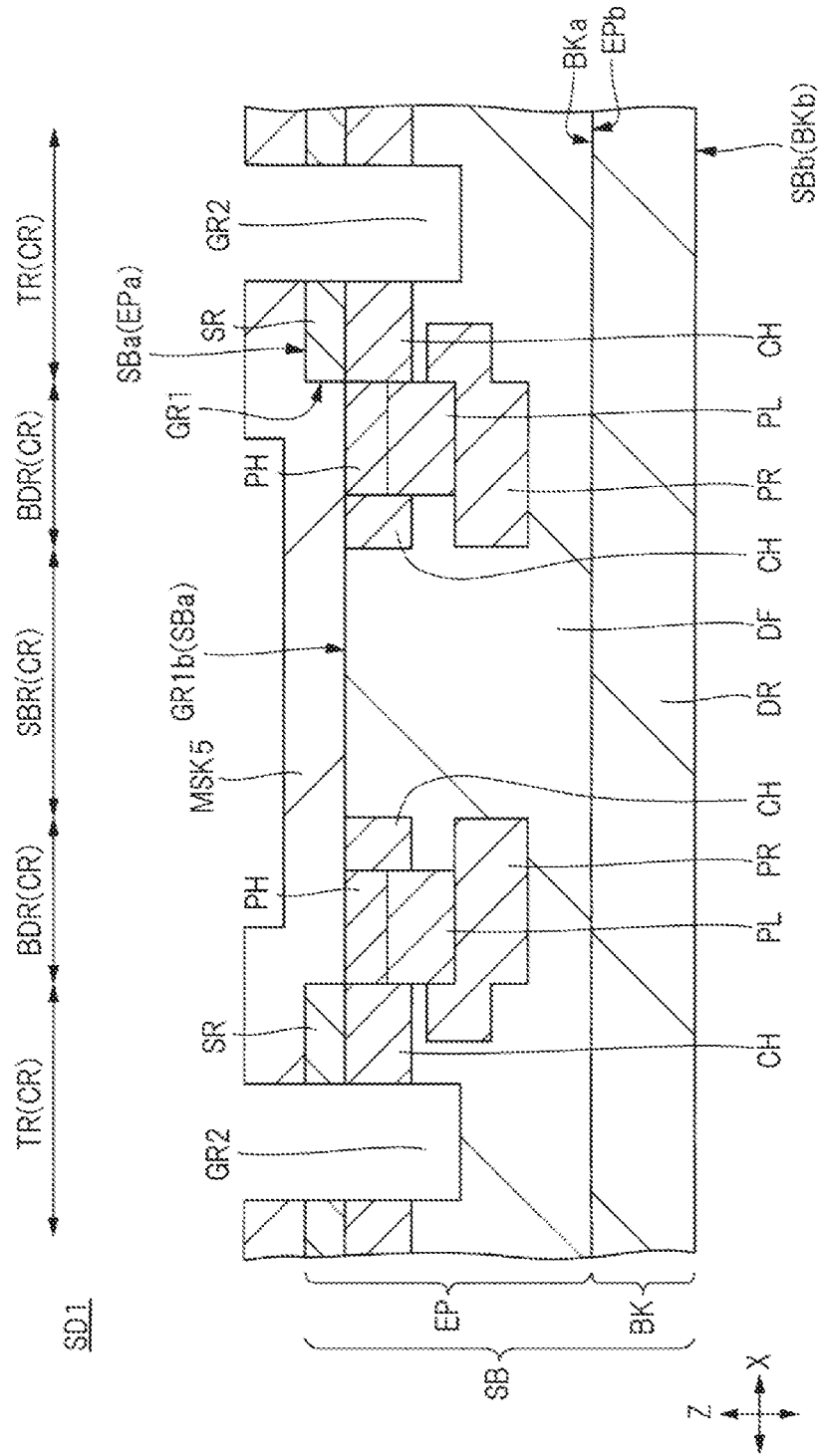
FIG. 11 is a cross-sectional view in a manufacturing step of the semiconductor device in the embodiment.

FIG. 11 shows a step of forming a groove GR2. On the main surface SBa, a mask film MSK5 covering a part of the transistor region TR, the body diode region BDR, and the Schottky barrier diode region SBR and exposing the other part of the transistor region TR is provided, and the semiconductor substrate SB is performed by dry-etching to form a groove GR2. The groove GR2 penetrates the source region SR and the channel formation region CH and reaches the drift layer DF. Precisely, the groove GR2 bites into the drift layer DF and is also formed inside the drift layer DF. A depth of the groove GR2 is about 1.2 µm from the main surface SBa. After the dry-etching step is completed, the mask film MSK5 is removed.

Figure 12:
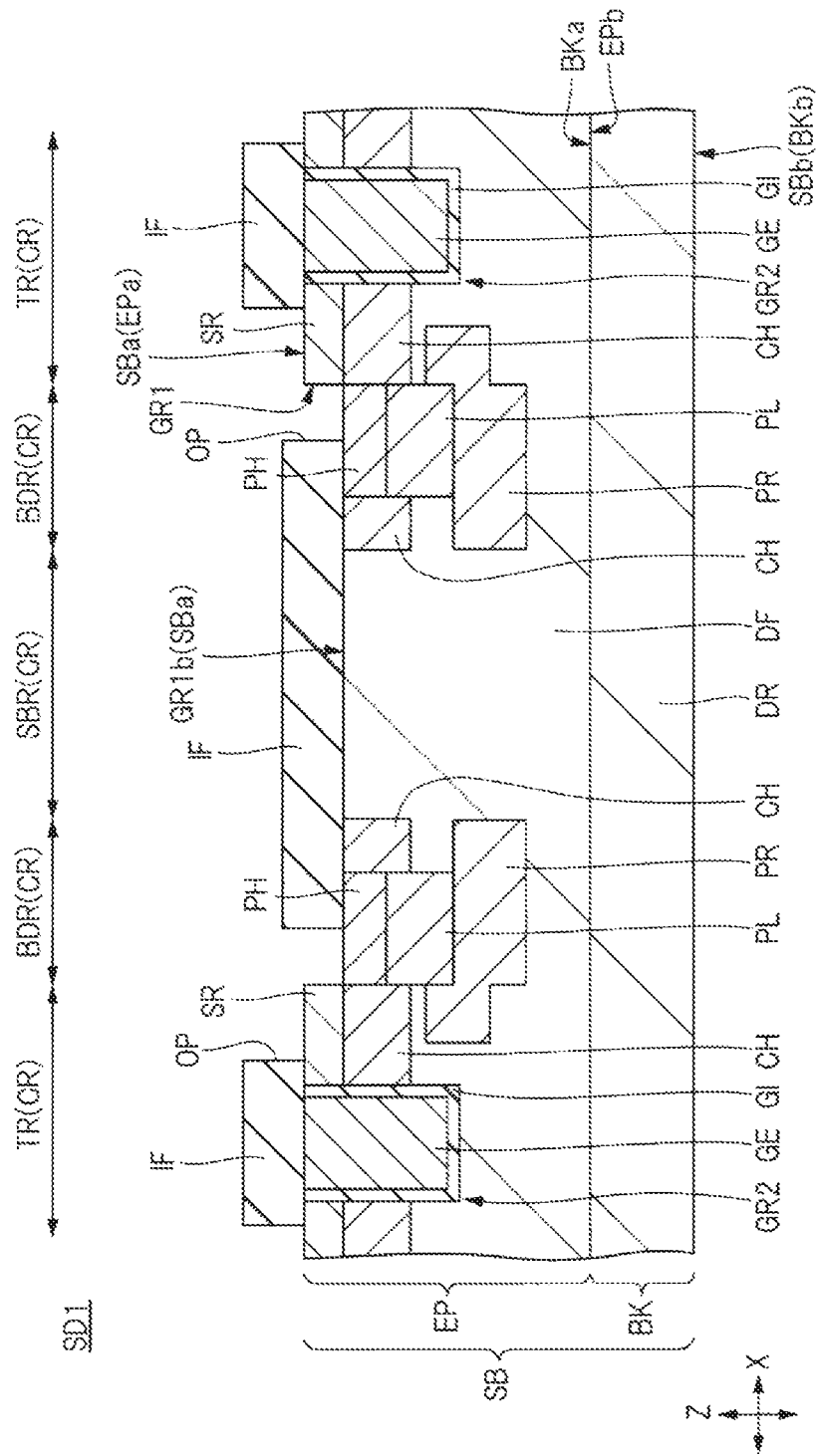
FIG. 12 is a cross-sectional view in a manufacturing step of the semiconductor device in the embodiment.

FIG. 12 shows a step of forming a gate dielectric film GI, a gate electrode GE, and an interlayer insulating film IF. In the groove GR2, the gate dielectric film GI and the gate electrode GE are formed in this order. The gate dielectric film GI is, for example, a silicon oxynitride film, and a bottom surface and a side surface of the groove GR2 are performed by an oxynitride treatment (for example, a heat treatment at 1300° C. in nitrogen monoxide (NO)) or are performed by an oxynitride treatment after a thermal oxidation (for example, a heat treatment at 1200° C. in a dry $O_2$). Next, after a conductive layer such as a polysilicon layer is deposited on the gate dielectric film GI, the gate electrode GE is formed by leaving the polysilicon layer in the groove GR2 selectively. Next, the interlayer insulating film IF is formed which covers the gate electrode GE and the Schottky barrier diode region SBR and has an opening OP exposing a portion of the source region SR and the p-type semiconductor region PH. The interlayer insulating film IF is formed of, for example, a silicon oxide film.

Figure 13:
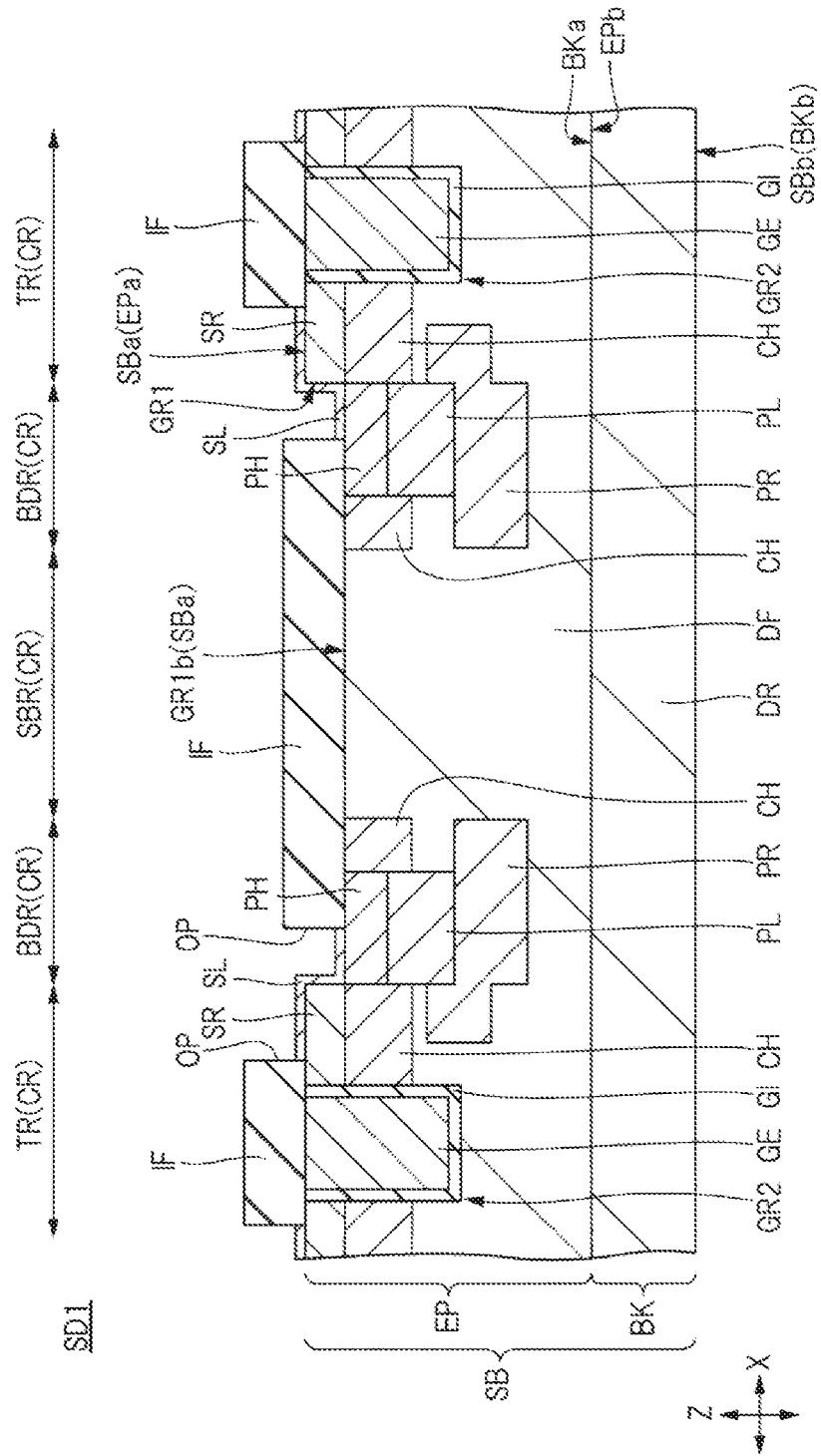
FIG. 13 is a cross-sectional view in a manufacturing step of the semiconductor device in the embodiment.

FIG. 13 shows a step of a silicide layer SL. A silicide layer SL is formed in a portion of the source region SR and a portion of the p-type semiconductor region PH exposed from the opening OP of the interlayer insulating film IF. The silicide layers SL may be, for example, nickel silicide (NiSi) or platinum-containing nickel silicide (PtNiSi).

Figure 14:
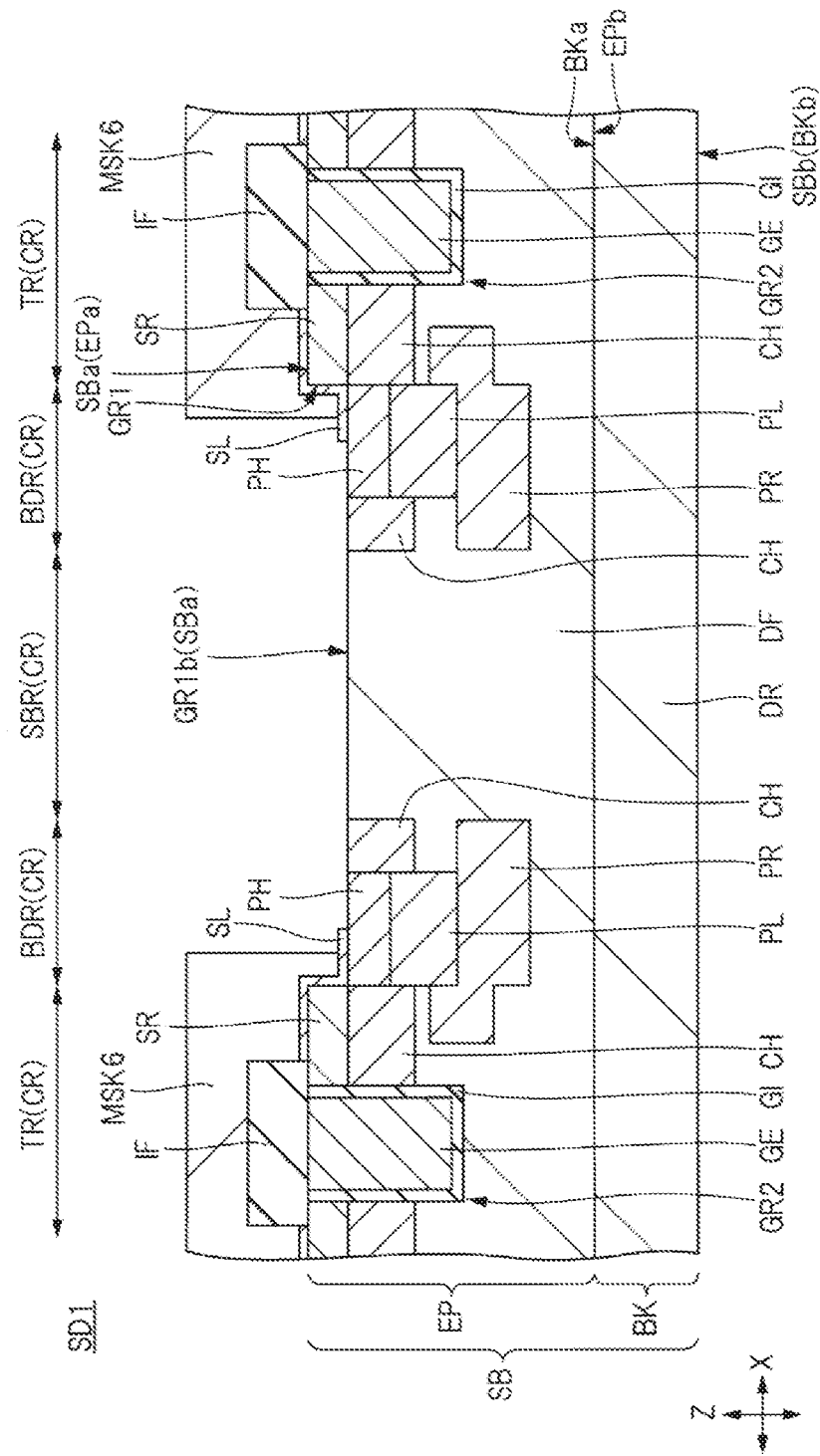
FIG. 14 is a cross-sectional view in a manufacturing step of the semiconductor device in the embodiment.

FIG. 14 shows a step of removing an interlayer insulating film IF. A mask film MSK6 is provided on the interlayer insulating film IF so as to cover a portion of the transistor region TR and the body diode region BDR and expose the other portion of the body diode region BDR and the Schottky barrier diode region SBR, and the interlayer insulating film IF covering the Schottky barrier diode region SBR is removed by, for example, wet etching. Then, in the Schottky barrier diode region SBR, the main surface SBa of the semiconductor substrate SB (in other words, the main surface EPa of the epitaxial layer EP, the main surface of the drift layer DF, or the bottom surface GR1b of the groove GR1) is exposed.

Figure 15:
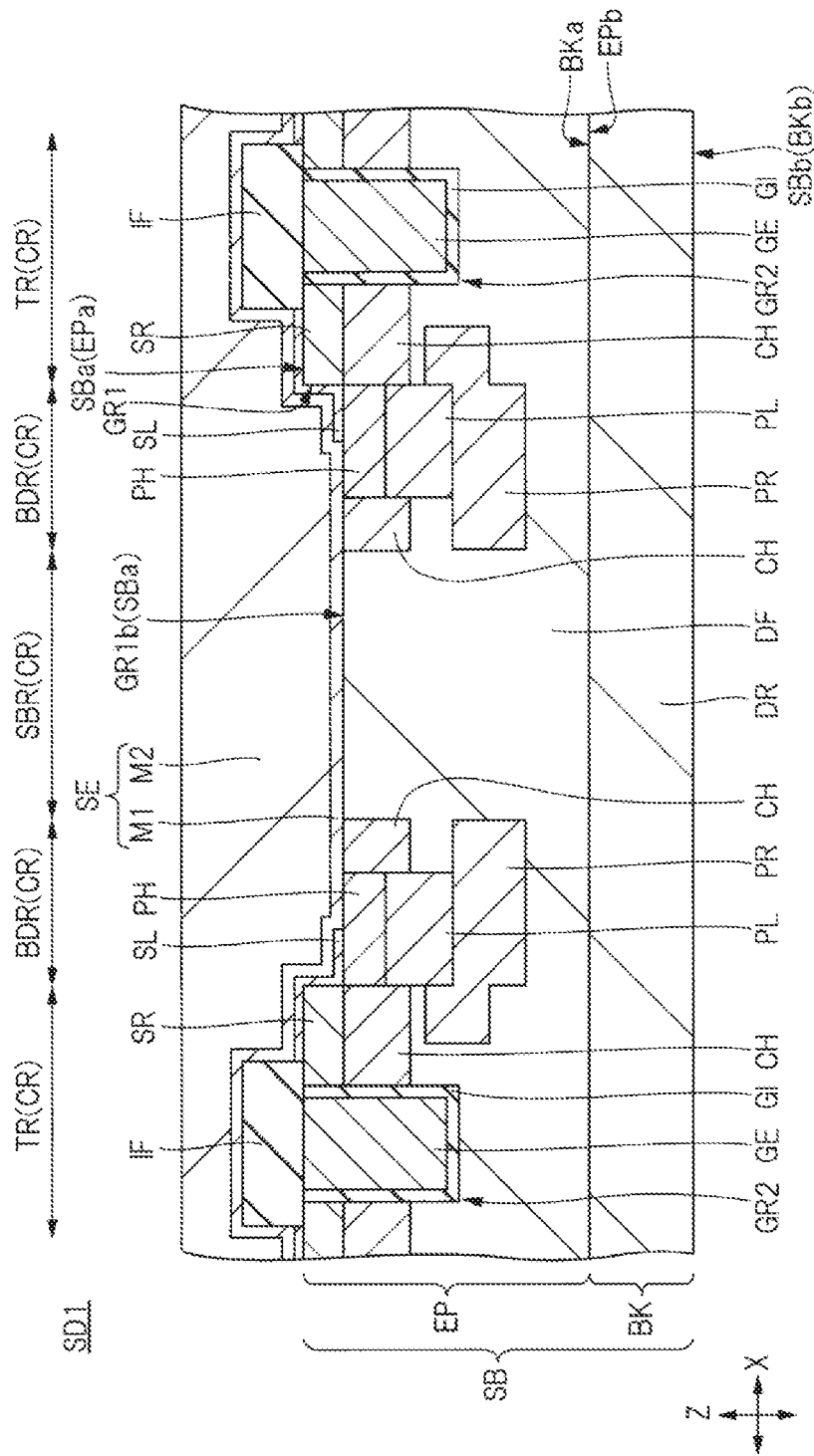
FIG. 15 is a cross-sectional view in a manufacturing step of the semiconductor device in the embodiment.

Next, as shown in FIG. 15, a source electrode SE is formed on the main surface SBa, and thereafter, as shown in FIG. 2, a drain electrode DE is formed on the back surface SBb. As shown in FIG. 15, the source electrode SE has a stacked structure of a metal layer M1 and a metal layer M2 formed on the metal layer M1. In the Schottky barrier diode region SBR, the metal layer M1 contacts the n-type drift layer DF to form Schottky junction. That is, the Schottky barrier diode is formed between the source electrode SE and the drift layer DF. Therefore, the metal layer M1 is made of a metal having a work function larger than that of the n-type semiconductor region constituting the drift layer DF, and is made of, for example, titanium (Ti), nickel (Ni), molybdenum (Mo), aluminum (Al), gold (Au), or platinum (Pt). The drain electrode DE are formed of, for example, a stack of nickel silicide (NiSi), titanium (Ti) and gold (Au) in order from the side contacting the drain regions DR (in other words, the substrate BK).

First Modified Example

Figure 19:
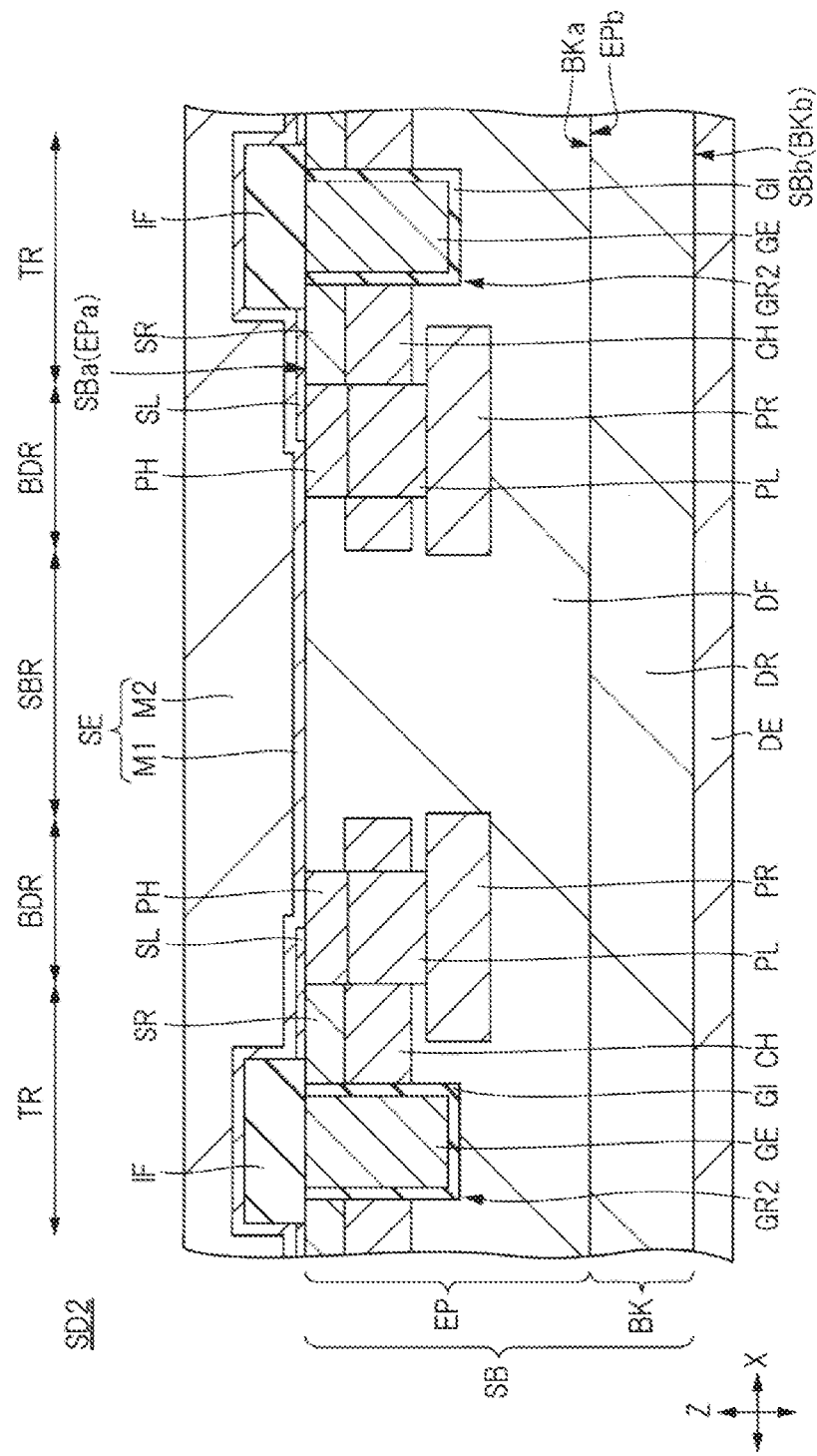
FIG. 19 is a cross-sectional view of a semiconductor device in a first modified example.
Figure 20:
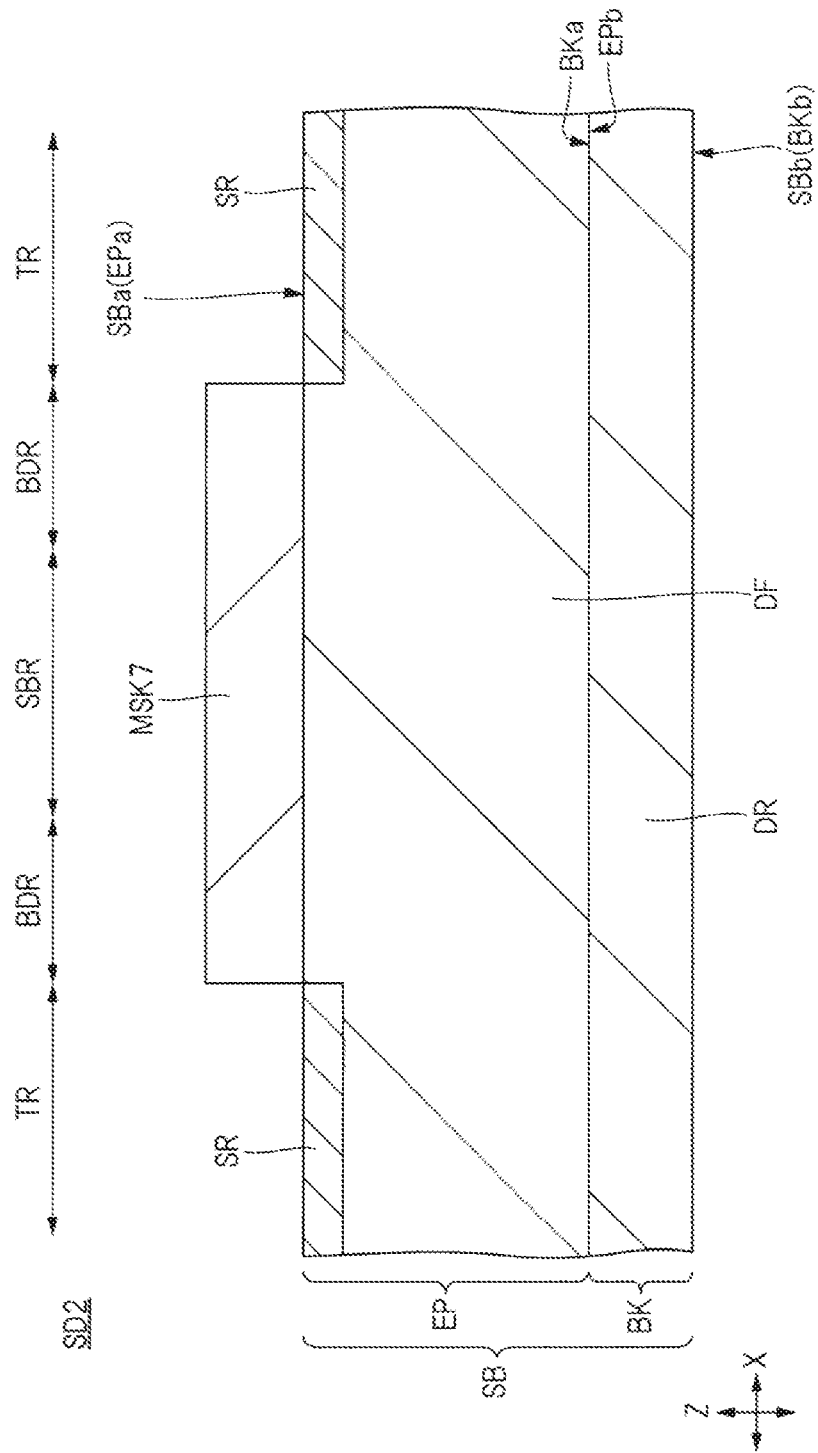
FIG. 20 is a cross-sectional view in a manufacturing step of the semiconductor device in the first modified example.
Figure 21:
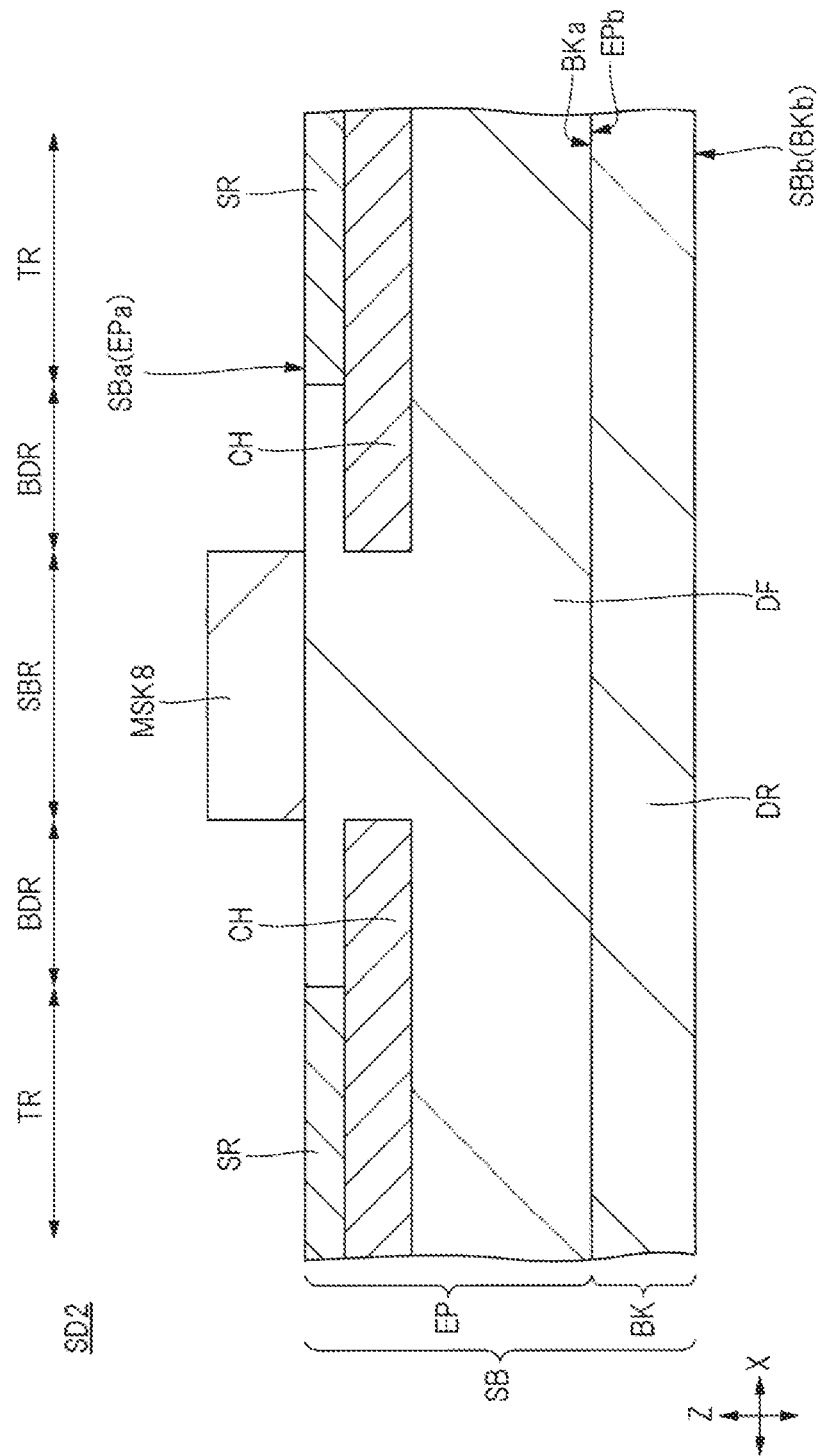
FIG. 21 is a cross-sectional view in a manufacturing step of the semiconductor device in the first modified example.

FIG. 19 is a cross-sectional view of a semiconductor device SD2 of a first modified example, and FIGS. 20 and 21 are cross-sectional view during a manufacturing step of the semiconductor device SD2 of the first modified example. The first modified example is a modified example to the above embodiment, and in the semiconductor device SD2 of the first modified example, the groove GR1 is not provided in the body diode region BDR and the Schottky barrier diode region SBR. That is, the main surface SBa of the semiconductor substrate SB in the transistor region TR and the main surface SBa of the semiconductor substrate SB in the body diode region BDR and the Schottky barrier diode region SBR have substantially the same height with respect to the back surface SBb of the semiconductor substrate SB. Even if there is difference in height between them, the difference in height is smaller than a thickness of the source region SR. The remaining elements are the same as those of the semiconductor device SD1 of the above embodiment and are denoted by the same reference numerals.

Also, in the semiconductor device SD2 of FIG. 19, since the p-type semiconductor region PL is provided, the equivalent circuit diagram shown in FIG. 3 and the voltage-current characteristic shown in FIG. 4 are obtained, and the reflux current can be increased without turning on the body diode BD2.

A manufacturing method of the semiconductor device SD2 of the first modified example will be described with respect to a step differing from the manufacturing step of the semiconductor device SD1 of the above embodiment. FIG. 20 shows a step of forming the source region SR. After preparing the semiconductor substrate SB, a mask film MSK7 covering the body diode region BDR and the Schottky barrier diode region SBR and exposing the transistor region TR is formed on the main surface SBa. Then, n-type impurities are ion-implanted into the epitaxial layer EP exposed from the mask film MSK7 to form the source regions SR. The source region SR is formed in the epitaxial layer EP (in other words, the drift layer DF) so as to be exposed on the main surface SBa. After the ion implantation step is completed, the mask film MSK7 is removed.

FIG. 21 shows a step of forming the channel formation region CH. A mask film MSK8 covering the Schottky barrier diode region SBR and exposing the transistor region TR and the body diode region BDR is formed on the main surface SBa. Then, p-type impurities are ion-implanted into the epitaxial layer EP exposed from the mask film MSK8 to form the channel formation region CH. The p-type channel formation region CH is formed on the back surface SBb side of the semiconductor substrate SB with respect to the source region SR and contacts the drift layer DF. After the ion implantation step is completed, the mask film MSK8 is removed.

Next, in the manufacturing method of the above described embodiment, the steps after the step of forming the p-type semiconductor region PH described with reference to FIG. 9 are performed to manufacture the semiconductor device SD2 of first modified example.

According to the semiconductor device SD2 of the first modified example, it is possible to omit the dry-etching process for forming the groove GR1 in the Schottky barrier diode region SBR. Therefore, a roughness (damage) of the main surface SBa of the semiconductor substrate SB due to the dry-etching process can be reduced, and a leakage current of the Schottky barrier diode can be reduced.

Second Modified Example

Figure 22:
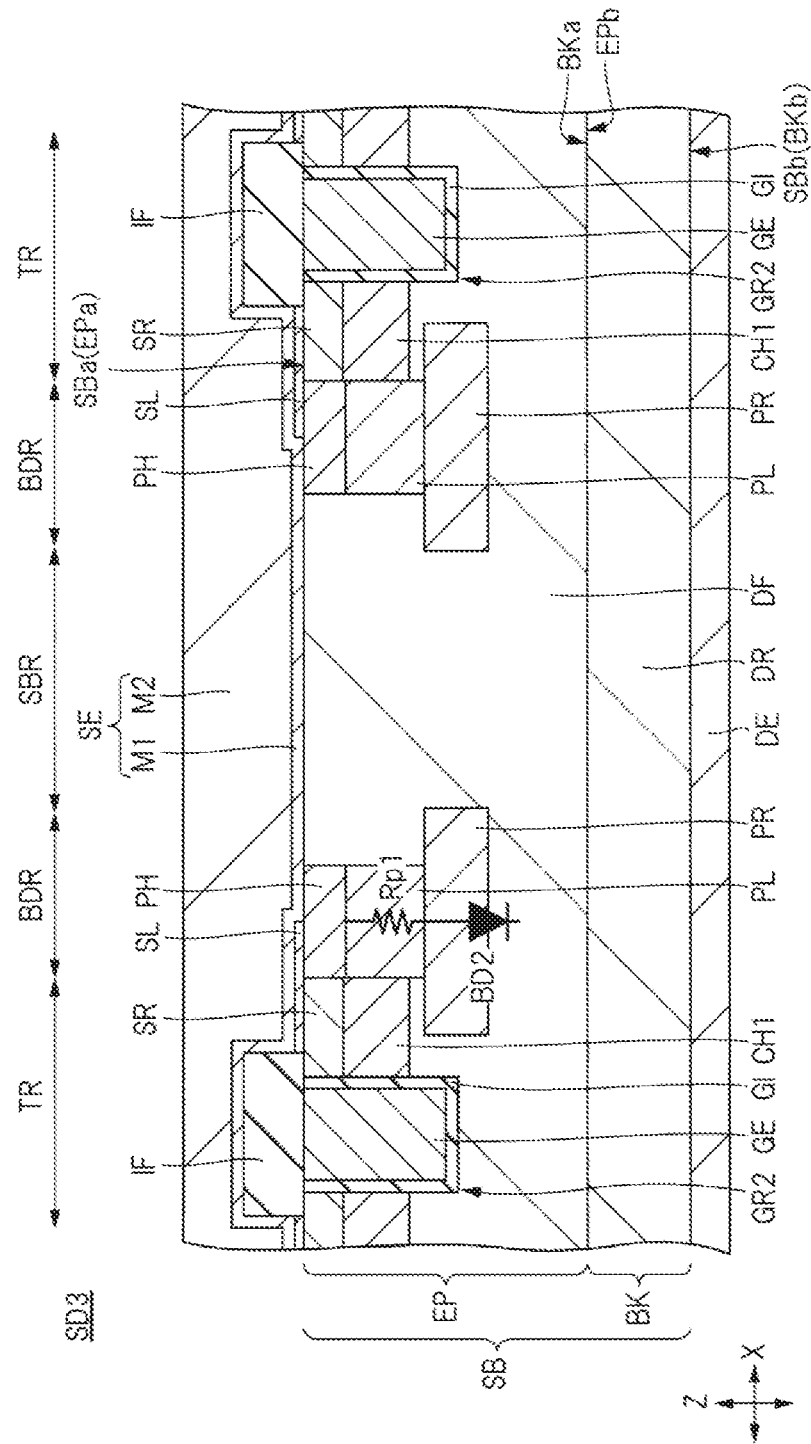
FIG. 22 is a cross-sectional view of a semiconductor device in a second modified example.
Figure 23:
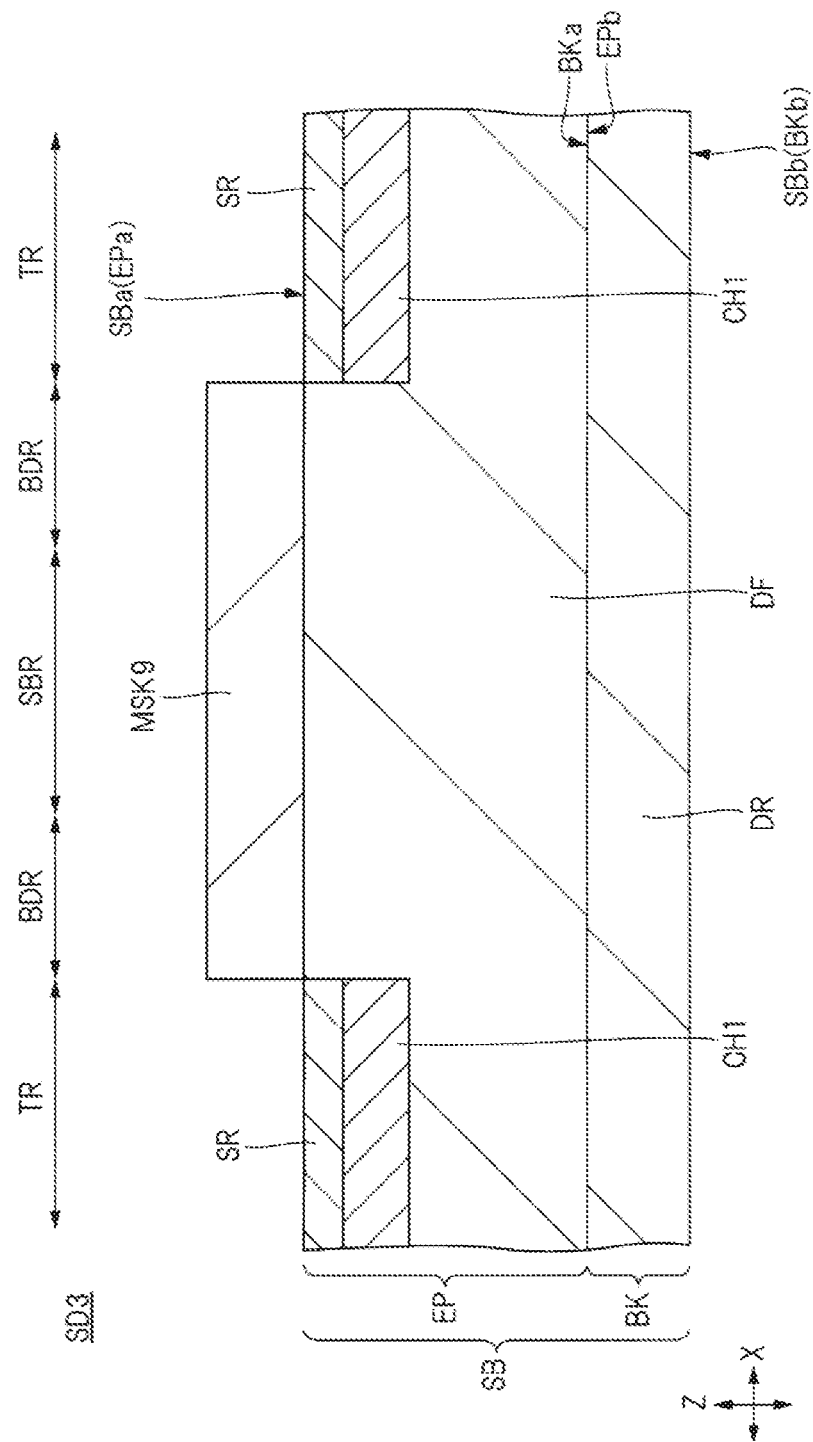
FIG. 23 is a cross-sectional view in a manufacturing step of the semiconductor device in the second modified example.

FIG. 22 shows a cross-sectional view of a semiconductor device SD3 of a second modified example, and FIG. 23 shows a cross-sectional view during a manufacturing step of the semiconductor device SD3 of the second modified example. The second modified example is a modified example for first modified example, and in the semiconductor device SD3 of the second modified example, the channel formation region CH1 is formed only in the transistor region TR. The other elements are the same as the semiconductor device SD2 of the above first modified example and are denoted by the same reference numerals.

As shown in FIG. 22, the channel formation region CH1 of the transistor region TR and the p-type semiconductor region PL of the body diode region BDR are in contact with each other. Unlike the above embodiment and the first modified example, the channel formation region CH1 does not extend to the body diode region BDR. Therefore, even in a relatively shallow portion of the p-type semiconductor region PL, an impurity concentration of the p-type semiconductor region PL can be decreased lower than the impurity concentration of the channel formation region CH1 without being affected by the channel formation region CH1. That is, the impurity concentration of the p-type semiconductor region PL can be decreased lower than the impurity concentration of the channel formation region CH1 in the entire region in the Z direction between the p-type semiconductor region PH and the p-type semiconductor region PR. Therefore, since the resistance (parasitic resistance) Rpt of the p-type semiconductor region PL can be increased larger than that of the p-type semiconductor region PL in the above embodiment and the first modified example, the reflux current can be increased without turning on the body diode BD2.

Next, a manufacturing method of the semiconductor device SD3 of the second modified example will be explained differently from that of the above mentioned first modified example. As shown in FIG. 23, in a step of forming the source region SR and the channel formation region CH1, after preparing the semiconductor substrate SB, a mask film MSK9 covering the body diode region BDR and the Schottky barrier diode region SBR and exposing the transistor region TR is formed on the main surface SBa. Then, n-type impurities are ion-implanted into the epitaxial layer EP exposed from the mask film MSK9 to form the source region SR, and p-type impurities are ion-implanted into the source region SR to form the channel formation region CH1. After the ion implantation step is completed, the mask film MSK9 is removed.

Next, in the manufacturing method of the above described embodiment, the steps after the step of forming the p-type semiconductor region PH described with reference to FIG. 9 are performed to manufacture the semiconductor device SD3 of the second modified example.

Note that the configuration of channel formation region CH1 in the second modified example can be applied to the above embodiment.

Third Modified Example

Figure 24:
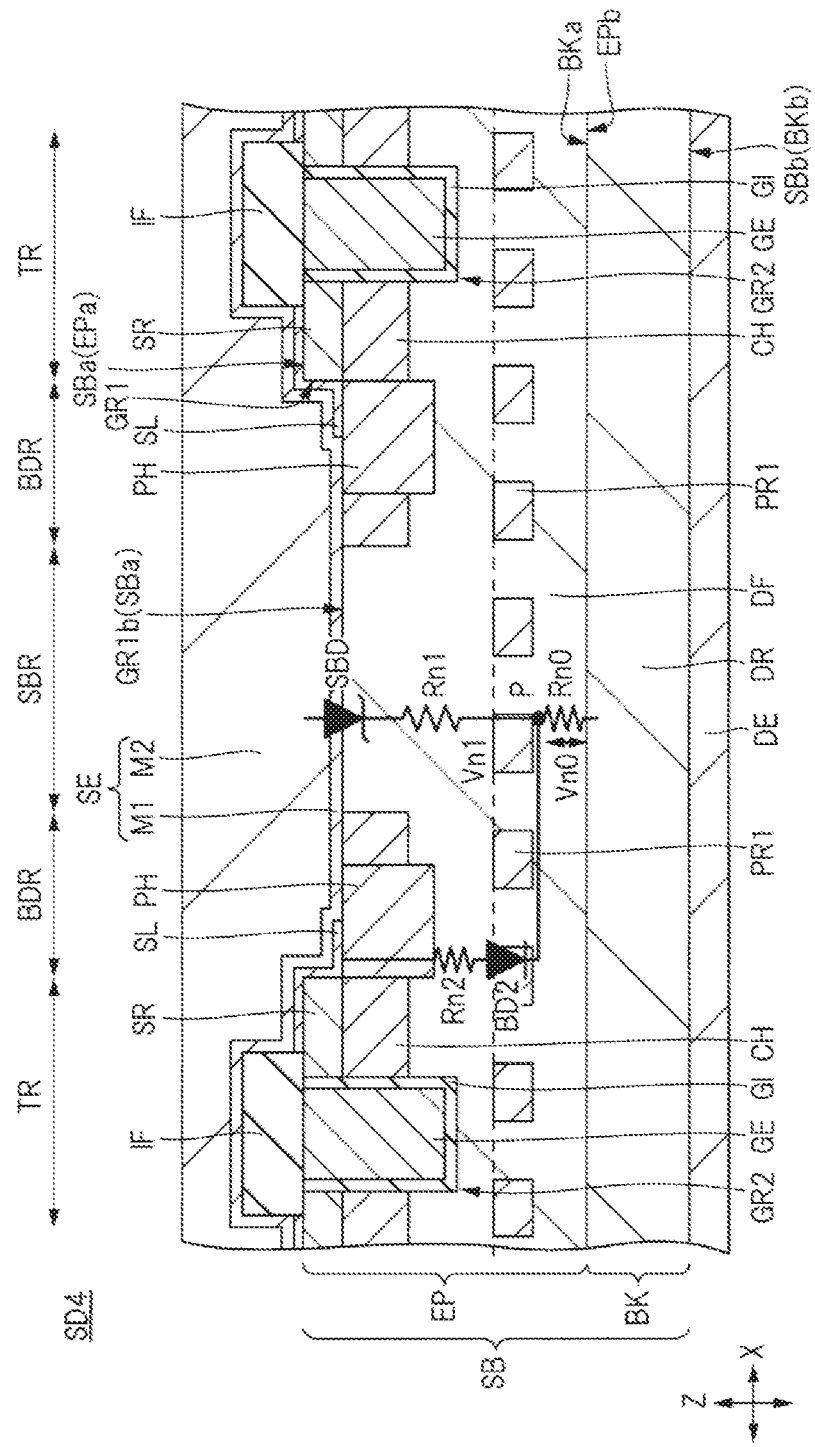
FIG. 24 is a cross-sectional view of a semiconductor device in a third modified example.
Figure 25:
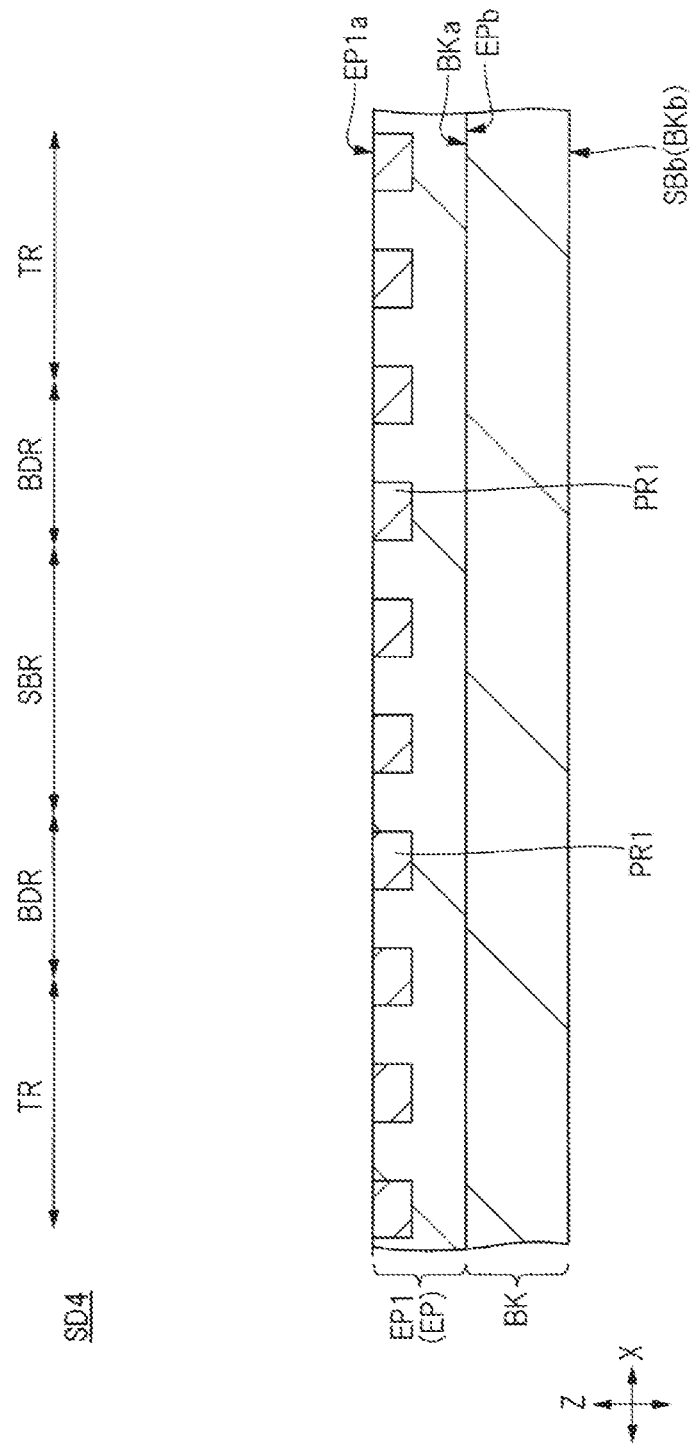
FIG. 25 is a cross-sectional view in a manufacturing step of the semiconductor device in the third modified example.
Figure 26:
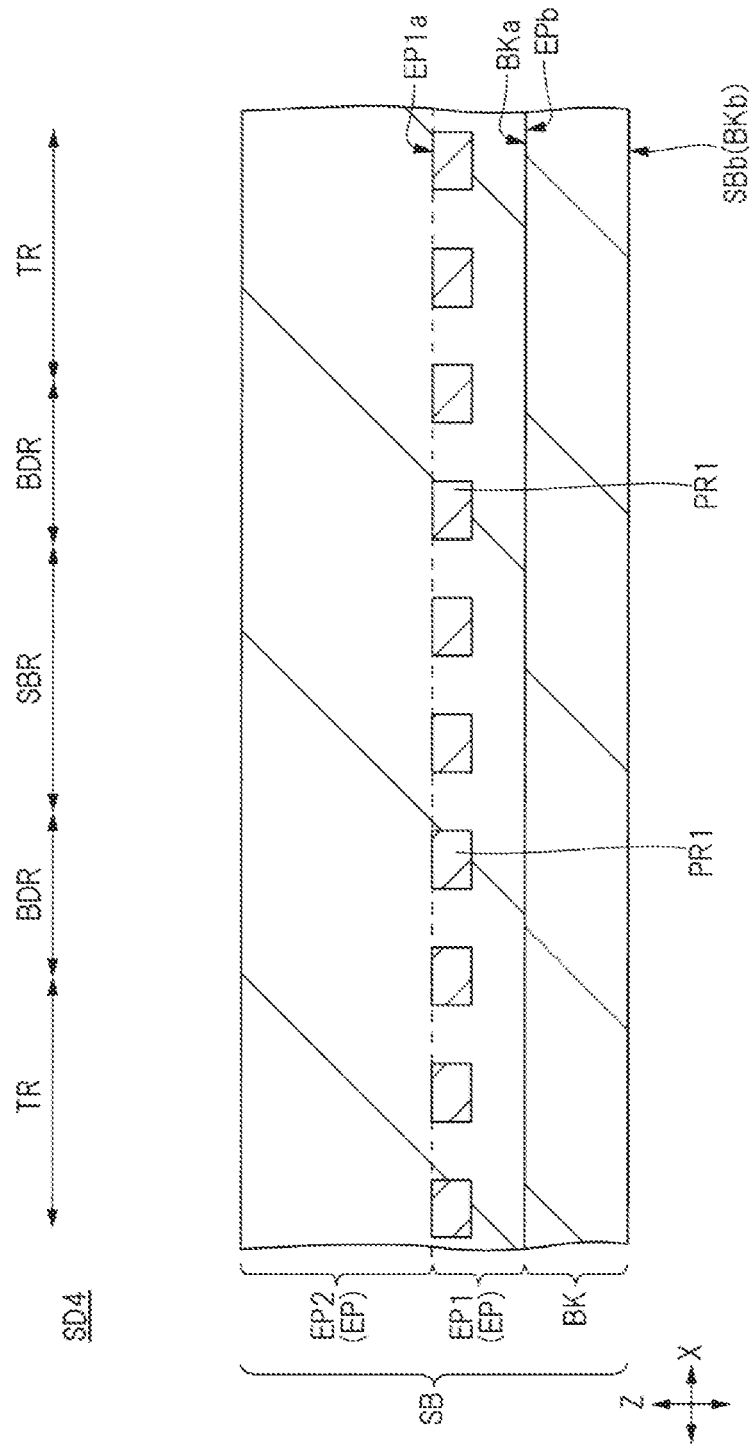
FIG. 26 is a cross-sectional view in a manufacturing step of the semiconductor device in the third modified example.

FIG. 24 is a cross-sectional view of a semiconductor device SD4 of a third modified example, and FIGS. 25 and 26 are cross-sectional view during a manufacturing step of the semiconductor device SD4 of the third modified example. The third modified example is a modified example to the above embodiment, and the p-type semiconductor region PL is not provided in the semiconductor device SD4.

As shown in FIG. 24, the p-type semiconductor region PR1 for relaxing an electric field between the drain region DR and the gate electrode GE is arranged in the transistor region TR, the body diode region BDR, and the Schottky barrier diode region SBR at predetermined interval in the X-direction. In the Z direction, the p-type semiconductor region PR1 is arranged away from the p-type semiconductor region PH, and the n-type drift layer DF having a resistance (parasitic resistance) Rn2 is interposed between the p-type semiconductor region PH and the p-type semiconductor region PR1.

Also in the semiconductor device SD4, since the n-type drift layer DF having the resistance (parasitic resistance) Rn2 is interposed between the p-type semiconductor region PH and the p-type semiconductor region PR1, the equivalent circuit diagram shown in FIG. 3 and the voltage-current characteristic shown in FIG. 4 are obtained, and the reflux current can be increased without turning on the body diode BD2.

Next, a manufacturing method of the semiconductor device SD4 of the third modified example will be described. The epitaxial layer EP of the semiconductor device SD4 has a stacked structure of an epitaxial layer EP1 and an epitaxial layer EP2. As shown in FIG. 25, the epitaxial layer EP1 having a film thickness of about 9 μm is formed on the main surface BKa of the substrate BK. Next, p-type impurity ions are implanted into the main surface EP1a of the epitaxial layer EP1 to form a plurality of p-type semiconductor regions PR1.

Next, as shown in FIG. 26, the epitaxial layer EP2 having a thickness of about 3 μm is formed on the main surface EP1a of the epitaxial layer EP1, and the semiconductor substrate SB in which the plurality of p-type semiconductor regions PR1 are embedded is formed. Hereinafter, the steps subsequent to the step of forming the source region SR of the above embodiment are performed to fabricate the semiconductor device SD4 of the third modified example. However, a step of forming the p-type semiconductor regions PL and PR in the body diode region BDR is excluded.

Note that the third modified example configuration can be applied to the above first modified example.

The invention made by the present inventor has been described above in detail based on the embodiment, but the present invention is not limited to the embodiment described above, and it is needless to say that various modified examples can be made without departing from the gist thereof. Part of the contents described in the above embodiments will be described below.

APPENDIX 1

A method of manufacturing a semiconductor device, comprising the steps of:

(a) providing a semiconductor substrate comprising
a first semiconductor layer having a first conductivity type including a first main surface and a second main surface as an opposite side to the first main surface, and
a second semiconductor layer having a first conductivity type arranged on the second main surface having impurity concentration higher than that of the first semiconductor layer;

(b) forming a first semiconductor region having the first conductivity type so as to expose to the first main surface side in a first region as a formation region of a MOSFET;

(c) forming a second semiconductor region having a second conductivity type opposite to the first conductivity type so as to arrange to the second main surface with respect to the first semiconductor region in the first region;

(d) forming a third semiconductor region having the second conductivity type so as to expose to the first main surface side in a second region as a formation region of a body diode;

(e) forming a forth semiconductor region having the second conductivity type so as to arrange to the second main surface with respect to the third semiconductor region in the second region;

(f) forming a fifth semiconductor region having the second conductivity type so as to arrange to the second main surface with respect to the forth semiconductor region in the second region;

(g) forming a first groove penetrating through the first and the second semiconductor regions and reaching to the first semiconductor layer;

(h) forming a gate electrode in the first groove via a gate insulating film; and (i) forming a metal layer on the first main surface in the first, the second and the third regions as a formation region of a Schottky barrier diode, wherein an impurity concentration of the forth semiconductor region is lower than that of the third and the fifth semiconductor regions, the body diode is configured between the fifth semiconductor region and the first semiconductor layer in the second region, and the Schottky barrier diode is configured between the metal layer and the first semiconductor layer in the third region.

APPENDIX 2

The method of manufacturing a semiconductor device according to the appendix 1, wherein in the step of (b) including:

(b-1) forming the first semiconductor region in the first, second and third regions, and (b-2) forming a second groove in the first main surface of the first semiconductor layer in the second and the third regions and thereby removing a part of the first semiconductor region and leaving the other part of the first semiconductor region in the first region.

APPENDIX 3

The method of manufacturing a semiconductor device according to the appendix 1, wherein in the step of (b) including:

(b-3) forming a first mask film covered the second and the third regions, (b-4) forming the first semiconductor region by implanting an impurity of the first conductivity type into the first semiconductor layer in the first region exposed from the first mask film.

APPENDIX 4

The method of manufacturing a semiconductor device according to the appendix 1, wherein in the step of (c), the second semiconductor region is selectively formed in the first semiconductor region by using a second mask film covered the second and the third regions.

APPENDIX 5

The method of manufacturing a semiconductor device according to the appendix 1, wherein the first semiconductor layer and the second semiconductor layer are made of silicon carbide.

APPENDIX 6

A method of manufacturing a semiconductor device, comprising the steps of:

(a) providing a semiconductor substrate comprising a first semiconductor layer having a first conductivity type including a first main surface and a second main surface as an opposite side to the first main surface, a first semiconductor region having a second conductivity type opposite to the first conductivity type and arranged dispersedly inside the first semiconductor layer along the first main surface, and a second semiconductor layer having the first conductivity type arranged on the second main surface having impurity concentration higher than that of the first semiconductor layer;

(b) forming a second semiconductor region having the first conductivity type so as to expose to the first main surface side in a first region as a formation region of a MOSFET;

(c) forming a third semiconductor region having the second conductivity type so as to arrange to the second main surface with respect to the second semiconductor region in the first region;

(d) forming a forth semiconductor region having the second conductivity type so as to expose to the first main surface side in a second region as a formation region of a body diode;

(e) forming a first groove penetrating through the second and the third semiconductor regions and reaching to the first semiconductor layer;

(f) forming a gate electrode in the first groove via a gate insulating film; and (g) forming a metal layer on the first main surface in the first, the second and the third regions which is a formation region of a Schottky barrier diode, wherein the first semiconductor region is arranged separately from the forth semiconductor region, a portion of the first semiconductor layer is interposed between the first semiconductor region and the forth semiconductor region, an impurity concentration of the first semiconductor region is lower than that of the forth semiconductor region, the body diode is configured between the first semiconductor region and the first semiconductor layer in the second region, and the Schottky barrier diode is configured between the metal layer and the first semiconductor layer in the third region.

What is claimed is:

1. A semiconductor device, comprising:
   a first main surface having a first region as a formation region of a body diode and a second region as a formation region of a Schottky barrier diode,
   a second main surface as an opposite side to the first main surface,
   a first semiconductor layer having a first conductivity type,
   a second semiconductor layer arranged on the second main surface, having the first conductivity type and having an impurity concentration higher than that of the first semiconductor layer,
   a first semiconductor region having a second conductivity type opposite to the first conductivity type and formed in the first semiconductor layer so as to expose to the first main surface side in the first region, a second semiconductor region having the second conductivity type and formed on the second main surface side with respect to the first semiconductor region in the first semiconductor region, a third semiconductor region having the second conductivity type and formed between the first semiconductor region and the second semiconductor region, and a metal layer formed on the first main surface in the first and the second regions, wherein an impurity concentration of the third semiconductor region is lower than that of the first and the second semiconductor regions, a body diode is configured between the second semiconductor region and the first semiconductor layer in the first region, and a Schottky barrier diode is configured between the metal layer and the first semiconductor layer in the second region.

2. The semiconductor device according to claim 1, wherein
the first semiconductor layer and the second semiconductor layer are made of silicon carbide.

3. The semiconductor device according to claim 2, wherein
an on-start voltage of the Schottky barrier diode is lower than an on-start voltage of the body diode.

4. The semiconductor device according to claim 1, wherein
in the first region, the metal layer is electrically connected to the first semiconductor region.

5. The semiconductor device according to claim 1, wherein
in cross-sectional view, the third semiconductor region contacts with the first semiconductor region and the second semiconductor region, and
in cross-sectional view, the second semiconductor region contacts with the metal layer via the first semiconductor region and the third semiconductor region.

6. The semiconductor device according to claim 1, wherein
the impurity concentration of the third semiconductor region is lower by ten times than the impurity concentration of the second semiconductor region.

7. The semiconductor device according to claim 6, wherein
the impurity concentration of the third semiconductor region is $1 \times 10^{17}/cm^3$ or less.

8. The semiconductor device according to claim 1, comprising:
a third region which is a MOSFET formation region in an opposite side of the second region with respect to the first region in the first main surface, wherein,
the third region further includes:
a fourth semiconductor region having the first conductivity type and formed in the first semiconductor layer so as to expose to the first main surface side,
a fifth semiconductor region having the second conductivity type and formed in the second main surface side with respect to the fourth semiconductor region, and
a gate electrode formed in a first groove, via a gate dielectric film, extending toward the second main surface from the first main surface, the first groove penetrating through the fourth and the fifth semiconductor regions and reaching to the first semiconductor layer.

9. The semiconductor device according to claim 8, wherein
the first semiconductor layer includes a second groove having a bottom surface in the first region and the second region of the first main surface, and
the first main surface of the third semiconductor layer is higher than the bottom surface with reference to the second main surface.

10. The semiconductor device according to claim 8, wherein
the third semiconductor region includes a portion overlapping the fifth semiconductor region and a portion not overlapping the fifth semiconductor region.

11. The semiconductor device according to claim 8, further comprising:
a forth region which is surrounding the first, the second, and the third regions,
the forth region further includes:
a sixth semiconductor region having the second conductivity type and formed in the first semiconductor layer so as to expose to the first main surface side,
a seventh semiconductor region having the second conductivity type and formed in the second main surface side with respect to the sixth semiconductor region, and
an eighth semiconductor region having the second conductivity type and formed between the sixth semiconductor region and the seventh semiconductor region, wherein,
an impurity concentration of the eighth semiconductor region is lower than that of the sixth and the seventh semiconductor regions, and
the metal layer is extended to the fourth region and is electrically connected to the seventh semiconductor region via the sixth and the eighth semiconductor regions.

12. A semiconductor device, comprising:
a first main surface having a first region as a formation region of a body diode and a second region as a formation region of a Schottky barrier diode,
a second main surface as an opposite side to the first main surface,
a first semiconductor layer having a first conductivity type,
a second semiconductor layer arranged on the second main surface, having the first conductivity type and having a high impurity concentration than the first semiconductor layer,
a first semiconductor region having a second conductivity type opposite to the first conductivity type and formed in the first semiconductor layer so as to expose to the first main surface side in the first region,
a second semiconductor region having the second conductivity type and formed on the second main surface side with respect to the first semiconductor region in the first region,
a metal layer formed on the first main surface in the first and the second regions, wherein
the second semiconductor region is arranged separately from the first semiconductor region,
a portion of the first semiconductor layer is interposed between the second semiconductor region and the first semiconductor region,
an impurity concentration of the second semiconductor region is lower than that of the first semiconductor region, a body diode is configured between the second semiconductor region and the first semiconductor layer in the first region, and a Schottky barrier diode is configured between the metal layer and the first semiconductor layer in the second region.

13. The semiconductor device according to claim 12, wherein the first semiconductor layer and the second semiconductor layer are made of silicon carbide.

14. The semiconductor device according to claim 13, wherein an on-start voltage of the Schottky barrier diode is lower than an on-start voltage of the body diode.

15. The semiconductor device according to claim 12, further comprising:

a third region which is a MOSFET formation region in the first main surface, wherein, the third region further includes:

a third semiconductor region having the first conductivity type and formed in the first semiconductor layer so as to expose to the first main surface side, a forth semiconductor region having the second conductivity type and formed in the second main surface side with respect to the third semiconductor region, and a gate electrode formed in a groove, via a gate dielectric film, extending toward the second main surface from the first main surface, penetrating through the third and the forth semiconductor regions and reaching to the first semiconductor layer.

* * * * *